US 010600788B2

(12) United States Patent
Sandhu et al.

(10) Patent No.: US 10,600,788 B2
(45) Date of Patent: Mar. 24, 2020

(54) INTEGRATED ASSEMBLIES COMPRISING STUD-TYPE CAPACITORS

(71) Applicant: Micron Technology, Inc., Boise, ID (US)

(72) Inventors: Gurtej S. Sandhu, Boise, ID (US); Matthew N. Rocklein, Boise, ID (US); Brett W. Busch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/003,571

(22) Filed: Jun. 8, 2018

(65) Prior Publication Data

US 2019/0027478 A1 Jan. 24, 2019

Related U.S. Application Data

(62) Division of application No. 15/656,999, filed on Jul. 21, 2017, now Pat. No. 10,177,152.

(51) Int. Cl.
*H01L 27/108* (2006.01)
*H01L 49/02* (2006.01)

(52) U.S. Cl.
CPC .. *H01L 27/10817* (2013.01); *H01L 27/10814* (2013.01); *H01L 27/10852* (2013.01); *H01L 28/90* (2013.01)

(58) Field of Classification Search
None
See application file for complete search history.

(56) References Cited

U.S. PATENT DOCUMENTS

| 5,633,781 A | 5/1997 | Saenger et al. |
| 2003/0151083 A1* | 8/2003 | Matsui ............... C23C 16/18 257/310 |
| 2005/0048715 A1* | 3/2005 | Rupp ............ H01L 27/10864 438/244 |
| 2007/0272963 A1 | 11/2007 | Kishida |

* cited by examiner

*Primary Examiner* — Wael M Fahmy
*Assistant Examiner* — Sarah K Salerno
(74) *Attorney, Agent, or Firm* — Wells St. John P.S.

(57) ABSTRACT

Some embodiments include an integrated capacitor assembly having a conductive pillar supported by a base, with the conductive pillar being included within a first electrode of a capacitor. The conductive pillar has a first upper surface. A dielectric liner is along an outer surface of the conductive pillar and has a second upper surface. A conductive liner is along the dielectric liner and is included within a second electrode of the capacitor. The conductive liner has a third upper surface. One of the first and third upper surfaces is above the other of the first and third upper surfaces. The second upper surface is at least as high above the base as said one of the first and third upper surfaces. Some embodiments include memory arrays having capacitors with pillar-type first electrodes.

18 Claims, 28 Drawing Sheets

INTEGRATED ASSEMBLIES COMPRISING STUD-TYPE CAPACITORS

This patent resulted from a divisional of U.S. patent application Ser. No. 15/656,999, which was filed Jul. 21, 2017, and which is hereby incorporated herein by reference.

TECHNICAL FIELD

Integrated assemblies comprising stud-type capacitors.

BACKGROUND

Capacitors may have many uses in integrated circuitry. For instance, capacitors may be incorporated into memory circuitry (e.g., dynamic random access memory (DRAM)), control circuitry, sensors, etc. Integrated capacitors generally have a storage node electrode, a dielectric material, and a plate electrode; with the dielectric material being between the storage node electrode and the plate electrode.

Two general types of capacitors are crown-type capacitors and stud-type (also referred to as pillar-type) capacitors. Crown-type capacitors have the storage node electrode configured in a container-shape, and may have the dielectric material and plate electrode extending into the container-shaped storage node. In contrast, stud-type capacitors have the storage node electrode configured as a pillar, and have the dielectric material and plate electrode extending around the pillar.

A continuing goal of integrated circuit fabrication is to increase integration density. A related goal is to develop capacitor architectures which consume a relatively small footprint over a semiconductor base, while still achieving suitable capacitive storage. Accordingly, capacitors may be formed to be increasingly tall and thin with increasing levels of integration.

As capacitors become increasingly tall and thin, the capacitors are subject to toppling. Stud-type capacitors may have increased structural stability as compared to crown-type capacitors, and accordingly may be more resistant to toppling than crown-type capacitors. However, difficulties have been encountered in obtaining consistent and uniform performance across arrays of highly integrated stud-type capacitors. It is desired to develop improved stud-type capacitor architectures.

BRIEF DESCRIPTION OF THE DRAWINGS

FIGS. 3-7 are sequential process stages.

FIG. 8 is a process stage alternative to that of FIG. 7.

FIGS. 9-19 are sequential process stages following the process stage of FIG. 7 or FIG. 8.

FIGS. 20 and 21 are sequential process stages alternative to the process stages of FIGS. 18 and 19.

FIGS. 22 and 23 are process stages alternative to the process stages of FIGS. 18 and 19.

FIG. 24 is a process stage alternative to that of FIG. 21.

DETAILED DESCRIPTION OF THE ILLUSTRATED EMBODIMENTS

Some embodiments include recognition that a problem with conventional stud-type capacitor configurations is that upper surfaces of the capacitor dielectric may become damaged during a fabrication process. Accordingly, some embodiments include stud-type capacitor architectures which effectively remove the upper regions of the capacitor dielectric from being incorporated into functioning portions of the stud-type capacitors. Such removal may be accomplished by vertically offsetting the upper surface of a capacitor plate electrode relative to the upper surface of a storage node electrode. Some embodiments additionally, or alternatively, include recognition that a problem with conventional stud-type capacitor configurations may be that lower surfaces of the capacitor dielectric may become damaged during a fabrication process, and such embodiments may effectively remove the lower regions of the capacitor dielectric from being incorporated into functioning portions of the stud-type capacitors by vertically offsetting the lower surface of a capacitor plate electrode relative to the lower surface of an outer periphery of the storage node electrode. Example embodiments are described below with reference to FIGS. 1-28.

Figure 1:
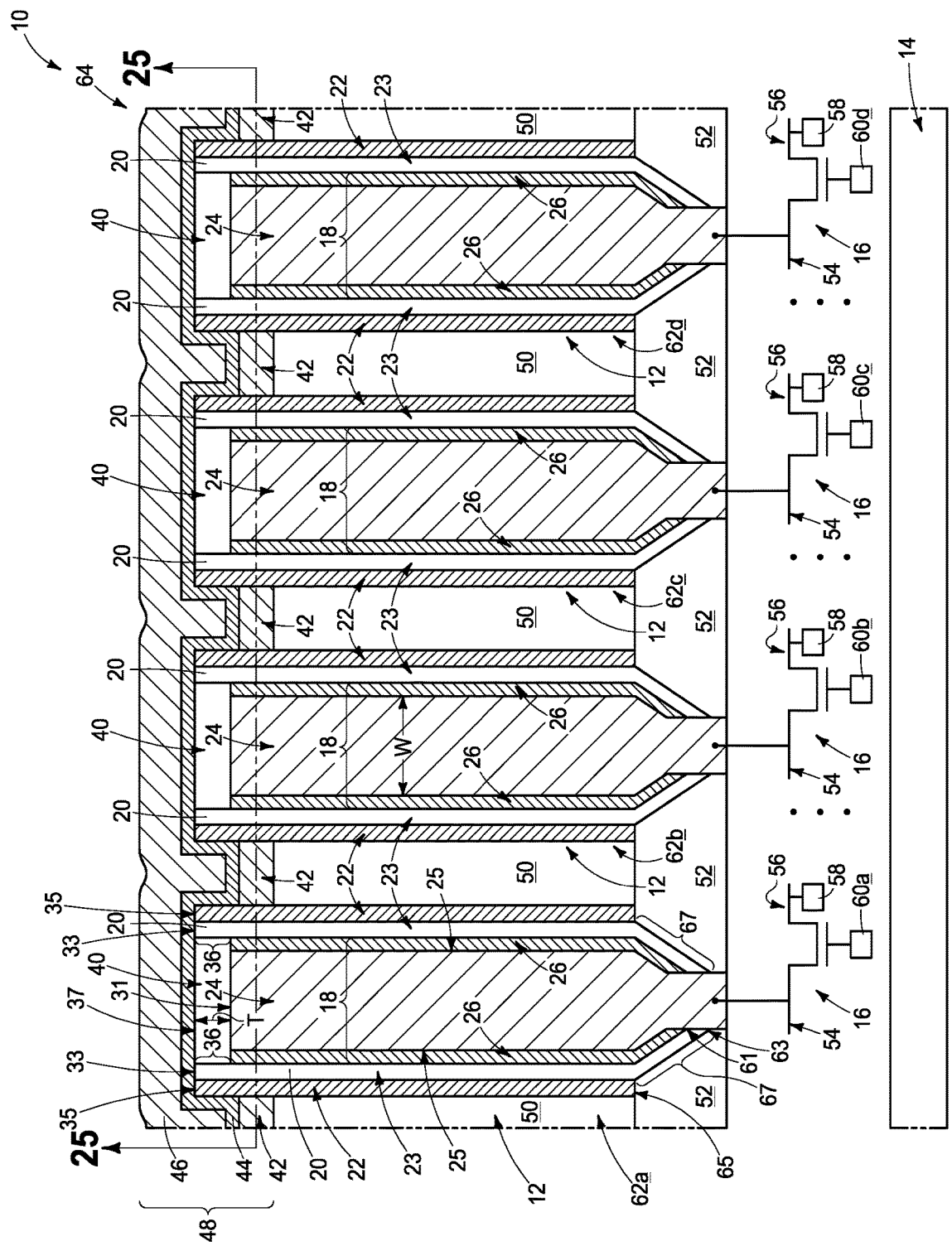
FIGS. 1 and 2 are diagrammatic cross-sectional views of regions of example integrated assemblies comprising example capacitors incorporated into memory arrays.

Referring to FIG. 1, such illustrates a region of an integrated assembly 10. The integrated assembly 10 includes a plurality of stud-type capacitors 12 supported over a base 14. Although four example capacitors 12 are illustrated, it is to be understood that an actual memory array may comprise a very high number of capacitors; with the actual number of capacitors in some example memory arrays being hundreds, thousands, millions, billions, etc.

The base 14 may comprise semiconductor material; and may, for example, comprise, consist essentially of, or consist of monocrystalline silicon. The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 14 may correspond to a semiconductor substrate containing one or more materials associated with integrated circuit fabrication. Such materials may include, for example, one or more of refractory metal materials, barrier materials, diffusion materials, insulator materials, etc.

In the illustrated embodiment, the capacitors 12 are spaced from the base 14 by an intervening gap. Additional materials and structures may be within such gap. For instance, in the shown embodiment transistors 16 are diagrammatically illustrated as being within the gap.

Each of the capacitors 12 includes a storage node electrode 18, a dielectric material 20 and a plate electrode 22. In some embodiments, the storage node electrodes 18 may be referred to as first electrodes, and the plate electrodes 22 may be referred to as second electrodes.

In the illustrated embodiment, the first electrodes 18 comprise conductive pillars 24 and conductive liners 26 extending along outer lateral surfaces of the conductive pillars. The conductive pillars 24 have outer sidewalls 25 (only labeled relative to one of the capacitors 12), and the conductive liners 26 are along and directly against such outer sidewalls. The conductive pillars 24 are viewed along a vertical cross-section in FIG. 1. Each of the conductive pillars 24 may have any suitable shape when viewed along a horizontal cross-section (i.e., a cross-section through the pillars and orthogonal to the vertical cross-section of FIG. 1); such as, for example, circular, square, rectangular, elliptical, etc. The conductive liners 26 extend entirely around lateral peripheries of the conductive pillars 24 (as shown in FIGS. 25-28 relative to example capacitor configurations in which the conductive pillars 24 have circular shapes when viewed along a horizontal cross-section).

The conductive pillar 24 and conductive liner 26 (e.g., the conductive structures of the first electrode 18), and the second electrode 22 of each capacitor 12 may comprise any suitable electrically conductive composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive liner 26 and the second electrode 22 of each capacitor 12 may comprise a same composition as one another. For instance, the conductive liner 26 and the second electrode 22 may both comprise metal nitride, such as, for example, titanium nitride. In some embodiments, the conductive liner 26 and the second electrode 22 of each capacitor 12 may comprise different compositions relative to one another. In some embodiments, the conductive liner 26 of each capacitor 12 may comprise metal nitride (e.g., titanium nitride), and the conductive pillar 24 of each capacitor may comprise metal (for instance, tungsten, titanium, etc.) and/or conductively-doped semiconductor (for instance, conductively-doped silicon, conductively-doped germanium, etc.).

The second electrode 22 and the liner 26 of each capacitor 12 may be formed to any suitable thicknesses; such as, for example, thicknesses within a range of from about 20 angstroms (Å) to about 50 Å. The conductive pillars 24 of the capacitors 12 may be formed to any suitable widths, W, along the cross-section section of FIG. 1, including, for example, widths within a range of from about 5 nanometers (nm) to about 100 nm.

The dielectric material 20 (i.e., the capacitor dielectric material) may comprise any suitable composition or combination of compositions; such as, for example, one or more of zirconium oxide, hafnium oxide, tantalum oxide, aluminum oxide, strontium titanate (STO), etc. In some embodiments, the dielectric material 20 may be considered to be configured as dielectric liners 23 along outer surfaces of the storage node electrodes 18 (i.e., laterally outward of conductive pillars 24). The second electrodes 22 may be referred to as conductive liners that extend along the dielectric liners 23.

The conductive pillars 24 have first upper surfaces 31 (only labeled relative to one of the capacitors 12), the dielectric liners 23 have second upper surfaces 33 (only labeled relative to one of the capacitors 12), and the conductive liners 22 have third upper surfaces 35 (only labeled relative to one of the capacitors 12). The first upper surfaces 31 of the conductive pillars 24 are beneath the third upper surfaces 35 of the second electrodes 22. The second upper surfaces 33 of the capacitor dielectric material 20 are above the first upper surfaces 31 of the conductive pillars 24, and in the shown embodiment are substantially coplanar with the third upper surfaces 35 of the second electrodes 22 (with the term "substantially coplanar" meaning coplanar to within reasonable tolerances of fabrication and measurement).

The functional capacitive portions of the dielectric material 20 are the portions laterally between the first electrode 24 and the second electrode 22 (i.e., the portions of the dielectric material at or below the elevation height of the first upper surfaces 31 in the embodiment of FIG. 1). Accordingly, regions 36 of the dielectric material 20 (only labeled relative to one of the capacitors) are not utilized as functional capacitive portions of the dielectric material. To the extent that there may be damage at the upper regions of the dielectric material 20 during fabrication of dielectric material 20, such damage will likely be contained entirely within the regions 36. Accordingly, the vertical offset of the first upper surfaces 31 of conductive pillar 24 relative to the second and third upper surfaces 33 and 35 of the capacitor dielectric material 20 and the second electrode 22 enables potentially-damaged portions of dielectric material 20 to be eliminated from the functional capacitive portions of the dielectric material utilized in the capacitors 12. The damaged upper regions of capacitor dielectric material 20 may be responsible for inconsistent performance characteristics of capacitors across conventional memory arrays. Accordingly, elimination of the damaged upper regions from the functional capacitor dielectric of the capacitors may enable improved consistency of performance amongst the numerous capacitors of a memory array as compared to conventional constructions.

In the shown embodiment, insulative pads 40 are over the conductive pillars 24 and conductive liners 26, and extend entirely across upper surfaces of the storage nodes 18. Such insulative pads they comprise any suitable composition or combination of compositions; and some embodiments may comprise silicon dioxide.

The insulative pads 40 have fourth upper surfaces 37 (only labeled relative to one of the capacitors 12), and such fourth upper surfaces 37 are substantially coplanar with the upper surfaces 33 of dielectric material 20 and the upper surfaces 35 of second electrodes 22.

The insulative pads have thicknesses, T. Upper surfaces 33 of the dielectric liners 23 are offset from the upper surfaces 31 of the conductive pillars 24 by the thickness T. The thickness T may comprise any suitable dimension; and in some embodiments, may be at least about 10 Å, at least about 50 Å, etc.

A conductive lattice 42 extends around upper regions of the capacitors 12 and directly contacts outer lateral surfaces of the second electrodes 22. The conductive lattice 42 may comprise any suitable conductive material, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive lattice 42 may comprise, consist essentially of, or consist of conductively-doped semiconductor material; such as, for example, one or both of conductively-doped silicon and conductively-doped germanium. The conductive doping may be n-type or p-type; and in some embodiments the conductive lattice 42 may comprise, consist essentially of, or consist of n-type doped silicon, n-type doped germanium or n-type doped silicon/germanium.

Conductive materials 44 and 46 are provided over the conductive lattice 42. Such conductive materials may comprise any suitable electrically conductive compositions or combinations of electrically conductive compositions. In some embodiments, the conductive material 44 may comprise, consist essentially of, or consist of metal nitride (for instance, titanium nitride), and the conductive material 46 may comprise, consist essentially of, or consist of metal (for instance, tungsten). The conductive material 44, conductive material 46 and conductive lattice 42 may be considered together to form a conductive plate 48. The conductive plate 48 extends across the insulative pads 40 and outwardly from the conductive liners 22, and electrically couples the conductive liners 22 of different capacitors 12 to one another. In some embodiments, the conductive lattice may be considered to be configured as a first conductive structure of the conductive plate 48, the conductive material 44 may be considered to be configured as a second conductive structure of the conductive plate 48, and the conductive structure 46 may be considered to be configured as a third conductive structure of the conductive plate 48.

In some embodiments, the electrically conductive material 44 may be referred to as a conductive region that extends across the insulative pads 40.

In some embodiments, the configuration of FIG. 1 may be considered to have the second electrodes 22 vertically overlapping conductive material of a conductive lattice 42, and in addition vertically overlapping conductive materials 44 and 46. In other embodiments, the second electrodes 22 may only vertically overlap the conductive material of lattice 42 rather than also vertically overlapping materials 44 and 46 (with an example of such other embodiments being described below with reference to FIG. 21). In the shown embodiment, the third upper surfaces 35 of the second electrodes 22 directly contact the electrically conductive material 44.

The capacitors 12 extend through insulative materials 50 and 52. Such insulative materials may comprise any suitable compositions or combinations of compositions. For instance, in some embodiments the insulative material 50 may comprise a silicate glass (e.g., borophosphosilicate glass (BPSG)), and the insulative material 52 may comprise silicon nitride.

In the shown embodiment, the conductive pillars 24 extend through the insulative material 52 and contact other materials (not shown) below such insulative material. The other materials may be electrically coupled with source/drain regions 54 of the illustrated transistors 16. Other source/drain regions 56 of the transistors 16 may be electrically coupled with a bitline 58. In some embodiments, the source/drain regions 54 may be referred to as first source/drain regions, and the source/drain regions 56 may be referred to as second source/drain regions. The transistors 16 have transistor gates which are electrically coupled with wordlines 60 (a-d). Each of the capacitors 12 is comprised by a memory cell 62 (a-d) of a memory array 64; with each memory cell being uniquely addressed through one of the wordlines (60(a-d)) and the bitline 58. In the shown embodiment, the capacitors 12 are connected to a common bitline 58, as would occur if the capacitors are in a common column as one another. In other embodiments, the illustrated capacitors may be electrically connected to a common wordline (as would occur if the capacitors were in a common row as one another), rather than to a common bitline.

In the shown embodiment, the liners 26 may be referred to as first conductive liners and the liners 22 may be referred to as second conductive liners. The first conductive liners 26 have first bottom surfaces 61, the dielectric liners 23 have second bottom surfaces 63, and the second conductive liners 22 have third bottom surfaces 65. The third bottom surfaces 65 are above the first and second bottom surfaces 61 and 63. The first bottom surfaces 61 may be vertically offset from the third bottom surfaces 65 by any suitable dimension; and in some embodiments may be vertically offset by a distance of at least about 50 Å.

Lower regions 67 of the dielectric material 20 (only labeled relative to one of the capacitors) are not utilized as functional capacitive portions of the dielectric material. To the extent that there may be damage at the lower regions of the dielectric material 20 during fabrication of dielectric material 20, such damage will likely be contained entirely within the regions 67. Accordingly, the vertical offsets of the first, second and third lower surfaces 61, 63 and 65 enables potentially-damaged portions of dielectric material 20 to be eliminated from the functional capacitive portions of the dielectric material utilized in the capacitors 12. Such may improve consistency of performance amongst the numerous capacitors of the memory array as compared to conventional constructions.

Figure 2:
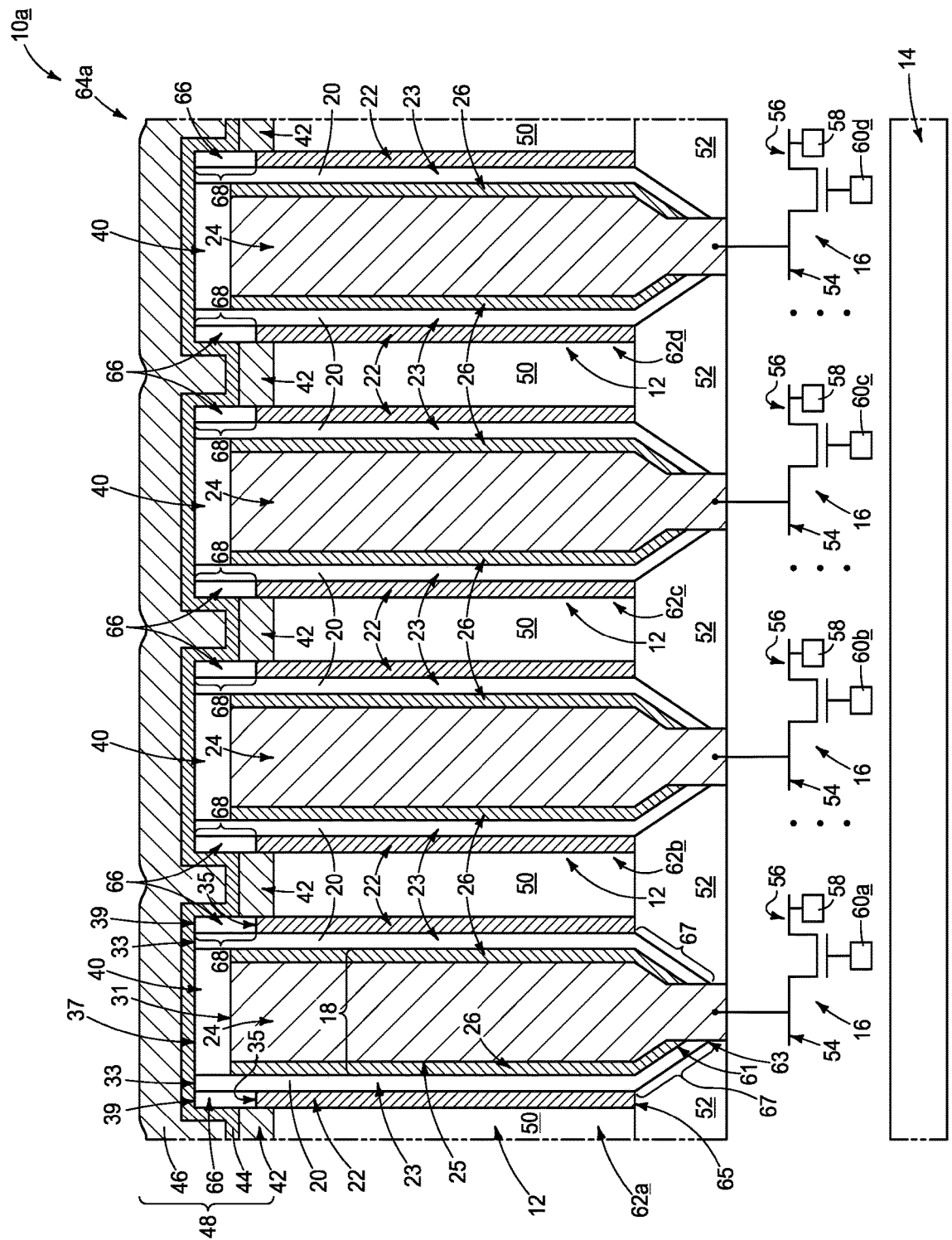

FIG. 2 shows an integrated assembly 10a which is similar to the integrated assembly 10 of FIG. 1, except that the third upper surfaces 35 of the second electrodes 22 are recessed relative to the assembly 10 of FIG. 1, and insulative spacers 66 are provided over such recessed third upper surfaces 35. The insulative spacers 66 may comprise any suitable composition or combination of compositions; and in some embodiments may comprise, consist essentially of, or consist of silicon nitride. The first, second and third upper surfaces 31, 33 and 35 of the conductive pillar 24, dielectric material 20 and second electrode 22, respectively, are arranged differently in the integrated assembly 10a of FIG. 2 as compared to the integrated assembly 10 of FIG. 1. Specifically, the integrated assembly 10a has the second upper surfaces 33 of dielectric material 20 above the first upper surfaces 31 of the conductive pillars 24 and the third upper surfaces 35 of the second electrodes 22; and has the third upper surfaces 35 of the second electrodes 22 beneath the first upper surfaces 31 of the conductive pillars 24. Although the first, second and third surfaces 31, 33 and 35 are arranged differently in the integrated assembly 10a of FIG. 2 as compared to the integrated assembly 10 of FIG. 1, a similar advantage is achieved in that upper regions of the dielectric material 20 (upper regions 68 in FIG. 2) are not utilized as functional capacitive portions of the dielectric material 20. Such may enable improved consistency of performance amongst the numerous capacitors of a memory array (e.g., memory array 64a of FIG. 2) as compared to conventional capacitor constructions.

In some embodiments, the insulative spacers 66 of FIG. 2 may be considered to have fifth upper surfaces 39 (only labeled relative to one of the capacitors 12); with such fifth upper surfaces being substantially coplanar with the fourth upper surfaces 37 of insulative pads 40 and the second upper surfaces 33 of dielectric material 20.

In the embodiment of FIG. 2, each of the insulative spacers 66 has a lateral thickness which is about the same as the lateral thickness of the underlying second electrode 22 (with the term "about the same" meaning that the compared thicknesses are the same to within reasonable tolerances of fabrication and measurement).

The spacers 66 vertically overlap the material of conductive lattice 42 in the embodiment of FIG. 2. In other embodiments, the spacers 66 may be entirely above the conductive lattice 42 (as described below with reference to an embodiment of FIG. 23). In the embodiment of FIG. 2, the spacers 66 also vertically overlap conductive materials 44 and 46 of the conductive plate 48. In other embodiments, the spacers 66 may only vertically overlap material of conductive lattice 42 (as described below with reference to FIG. 24).

The assemblies of FIGS. 1 and 2 (and analogous assemblies described below with respect to FIGS. 21, 23 and 24) may be formed with any suitable processing. Example processing is described with reference to FIGS. 3-24.

Figure 3:
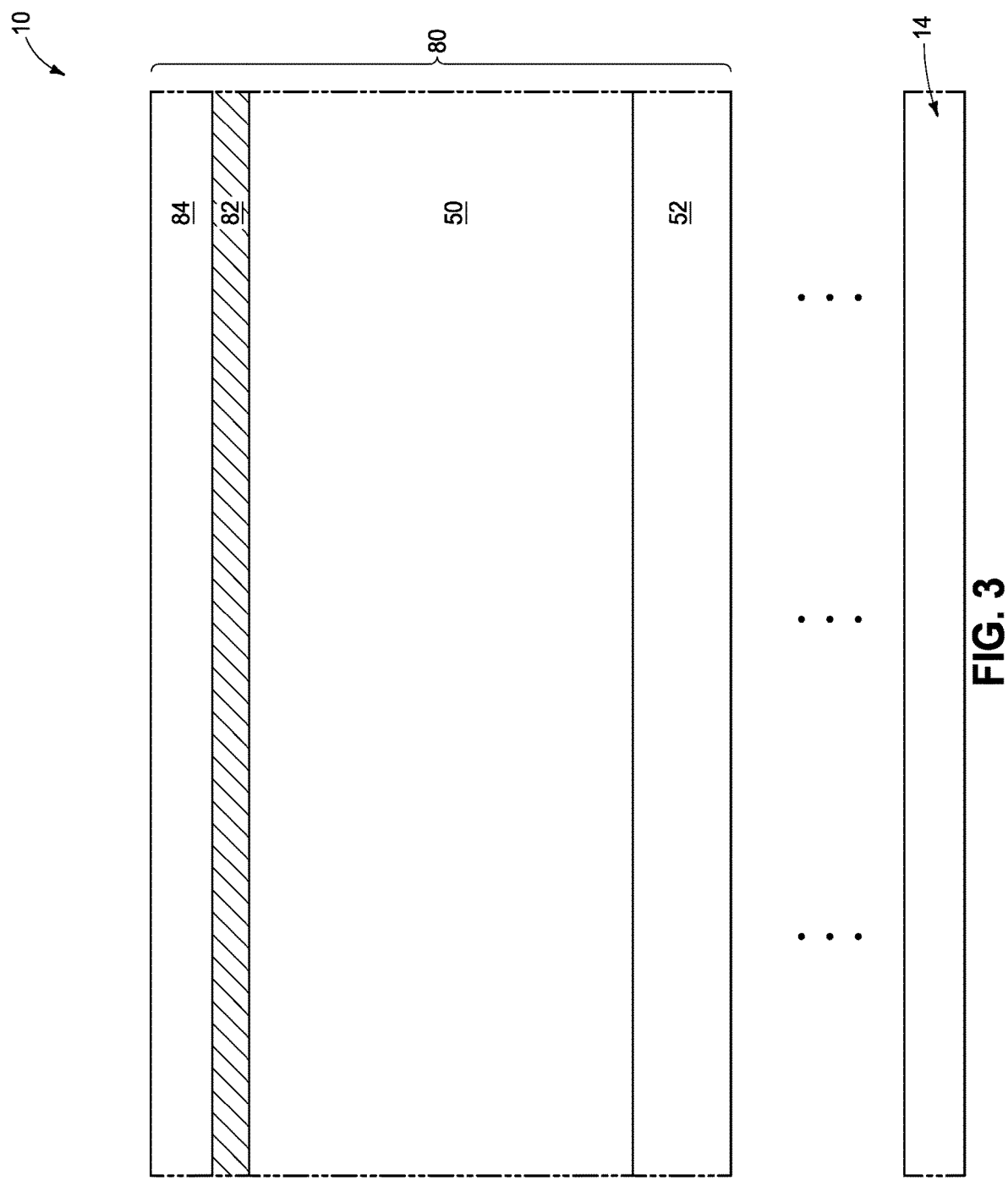
FIGS. 3-24 are diagrammatic cross-sectional views of regions of example assemblies at process stages associated with the fabrication of example capacitors.

Referring to FIG. 3, an assembly 10 comprises a stack 80 supported over the base 14. The stack 80 comprises conductive lattice material 82 over the insulative materials 50 and 52. The conductive lattice material 82 ultimately forms the conductive lattice 42 described above with reference to FIG. 1; and in some embodiments may comprise, consist essentially of, or consist of one or both of conductively-doped silicon and conductively-doped germanium. The insulative material 50 may comprise BPSG having a dopant gradient provided therein, or any other suitable insulative composition. The insulative material 52 may comprise silicon nitride, or any other suitable insulative composition.

A sacrificial material 84 is provided over the conductive lattice material 82. Such sacrificial material may comprise any suitable composition; and in some embodiments may comprise silicon nitride.

Figure 4:
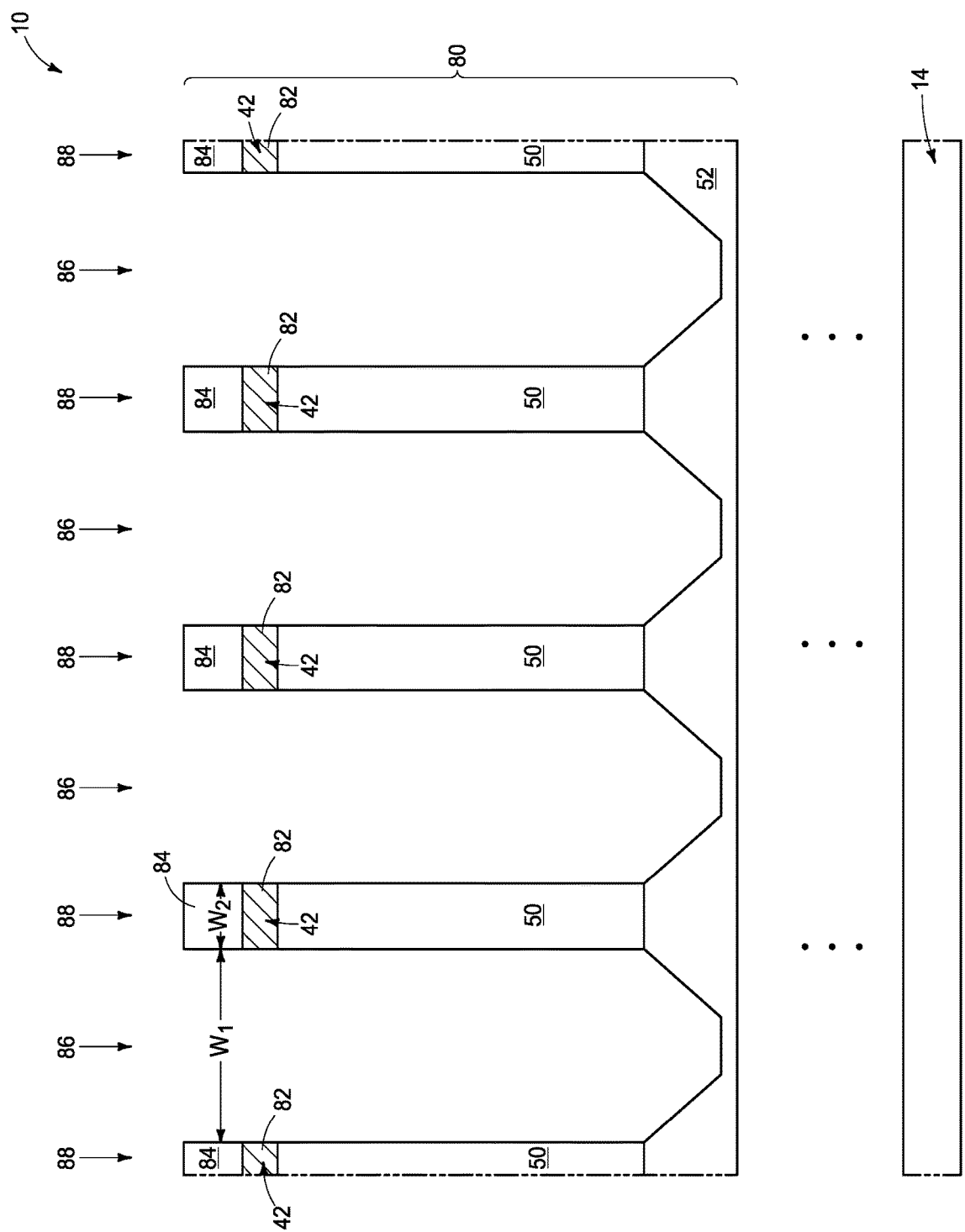

Referring to FIG. 4, openings 86 are etched into stack 80. Locations of the openings may be patterned with a photoresist mask (not shown) or with any other suitable methodology. The openings may be etched with any suitable etching chemistries, including, for example, one or more dry etches and/or one or more wet etches. The openings may have any suitable shapes and dimensions. In the shown embodiment, the openings have widths, $W_1$; and such widths may be within a range of from about 20 nm to about 70 nm. The openings are separated from one another by spacing regions 88, and such spacing regions have widths $W_2$; which in some embodiments may be less than or equal to about 10 nm, less than or equal to about 5 nm, etc. The openings 86 are shown to have vertical sidewalls which are relatively straight (i.e., orthogonal to an upper surface of base 14), at least along upper regions of the openings. Such may be desired in some embodiments. In other embodiments, the sidewalls may have other configurations.

The formation of openings 86 through conductive lattice material 82 patterns the material 82 into the conductive lattice 42 described above with reference to FIG. 1.

Figure 5:
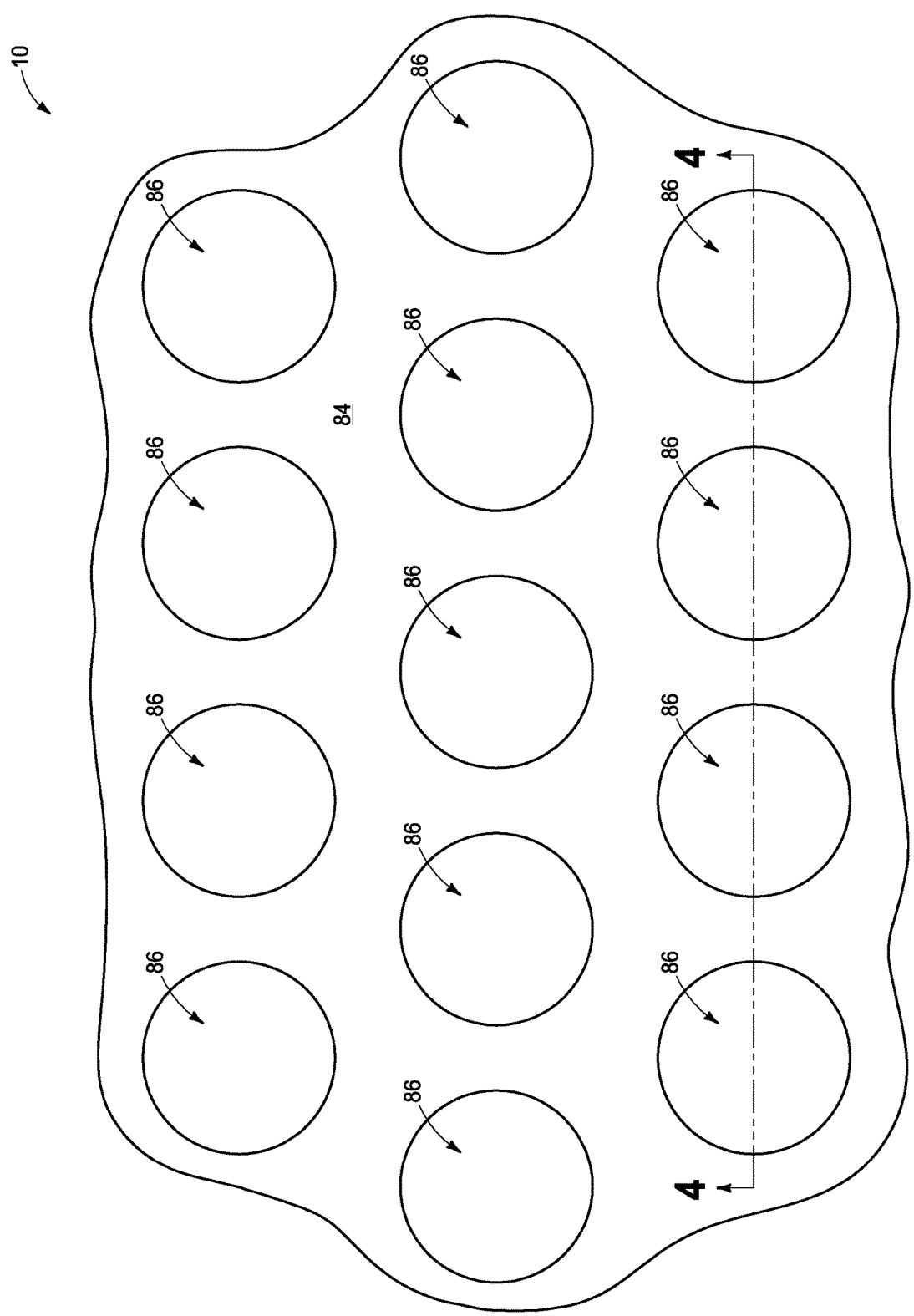

The openings 86 may be in any suitable arrangement. FIG. 5 shows a top view of the assembly 10 of FIG. 4, and shows the openings 86 in an hexagonally packed arrangement. The hexagonal packing may be desired in some applications in that such may achieve a very tight packing density of stud-type capacitors ultimately formed within the openings 86.

Figure 6:
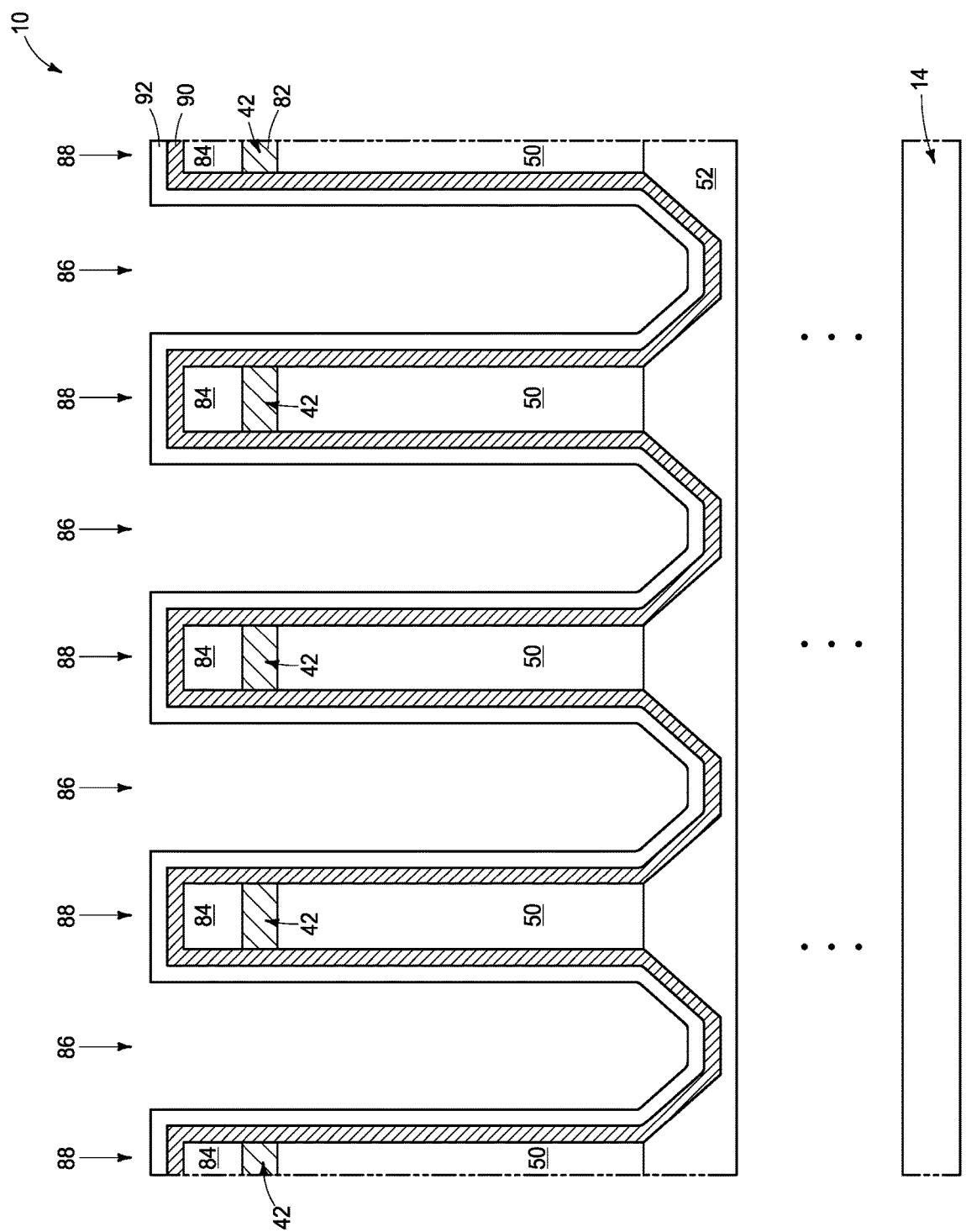

Referring to FIG. 6, assembly 10 is shown at a processing stage following that of FIG. 4. Conductive material 90 is formed within the openings 86, and sacrificial material 92 is formed over the conductive material 90. The conductive material 90 is ultimately patterned into the second electrodes 22 (FIG. 1), and accordingly may comprise any of the compositions described above relative to the second electrodes 22. In some embodiments, the conductive material 90 comprises titanium nitride formed to a thickness within a range of from about 20 Å to about 50 Å.

The sacrificial material 92 may comprise any suitable composition or combination of compositions; and in some embodiments may comprise polycrystalline silicon formed to a thickness within a range of from about 20 Å to about 50 Å.

Figure 7:
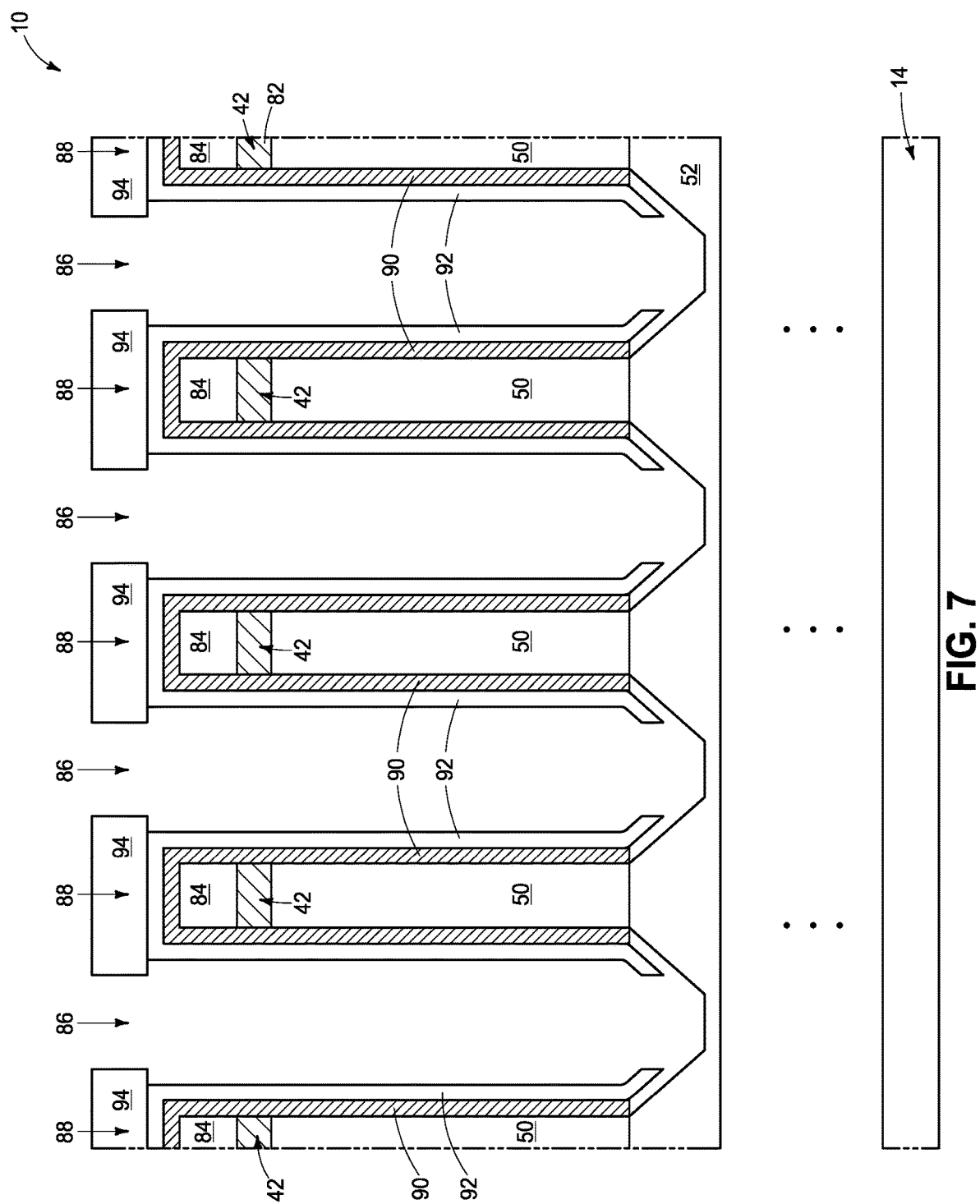

Referring to FIG. 7, masking material 94 is formed across the spacing regions 88 to partially block the openings 86. The masking material 94 may comprise, for example, one or more of carbon, silicon nitride, silicon oxide, etc.; and may be non-conformally deposited.

The masking material 94 is utilized to pattern openings etched through sacrificial material 92, and subsequently the conductive material 90 is etched back utilizing wet etching methodologies (for instance, utilizing ammonium hydroxide-based methodologies, or any other suitable methodologies).

Figure 8:
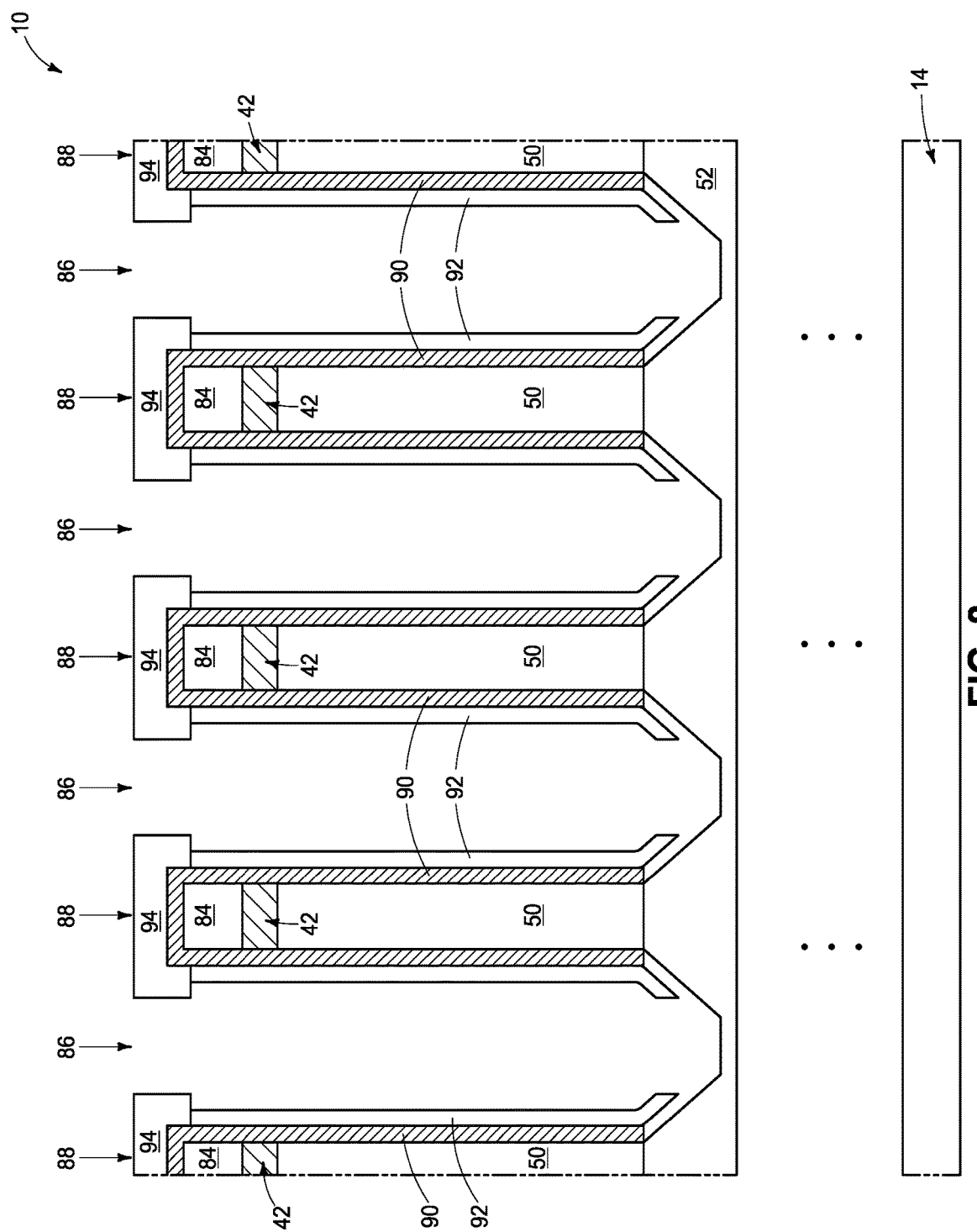

FIG. 8 shows a processing stage alternative to that of FIG. 7. Specifically, the sacrificial masking material 92 may be initially etched to expose surfaces of conductive material 90 over the spacing regions 88 as well as at the bottoms of openings 86. The masking material 94 may be subsequently provided over the spacing regions 88, followed by wet etching of conductive material 90.

Figure 9:
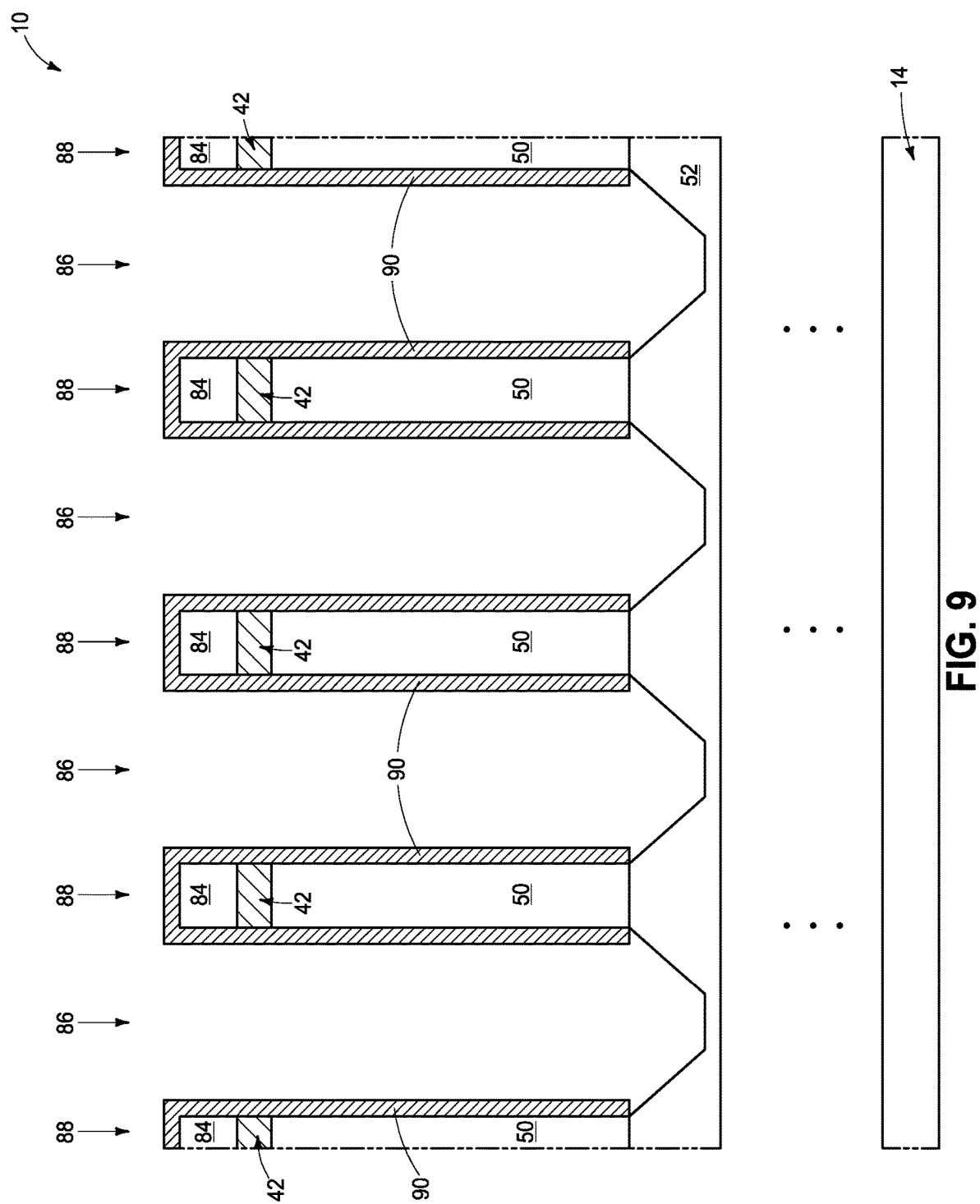

FIG. 9 shows a processing stage following that of either FIG. 7 or FIG. 8; and specifically shows assembly 10 after the sacrificial material 92 (FIGS. 7 and 8) and masking material 94 (FIGS. 7 and 8) are removed.

Figure 10:
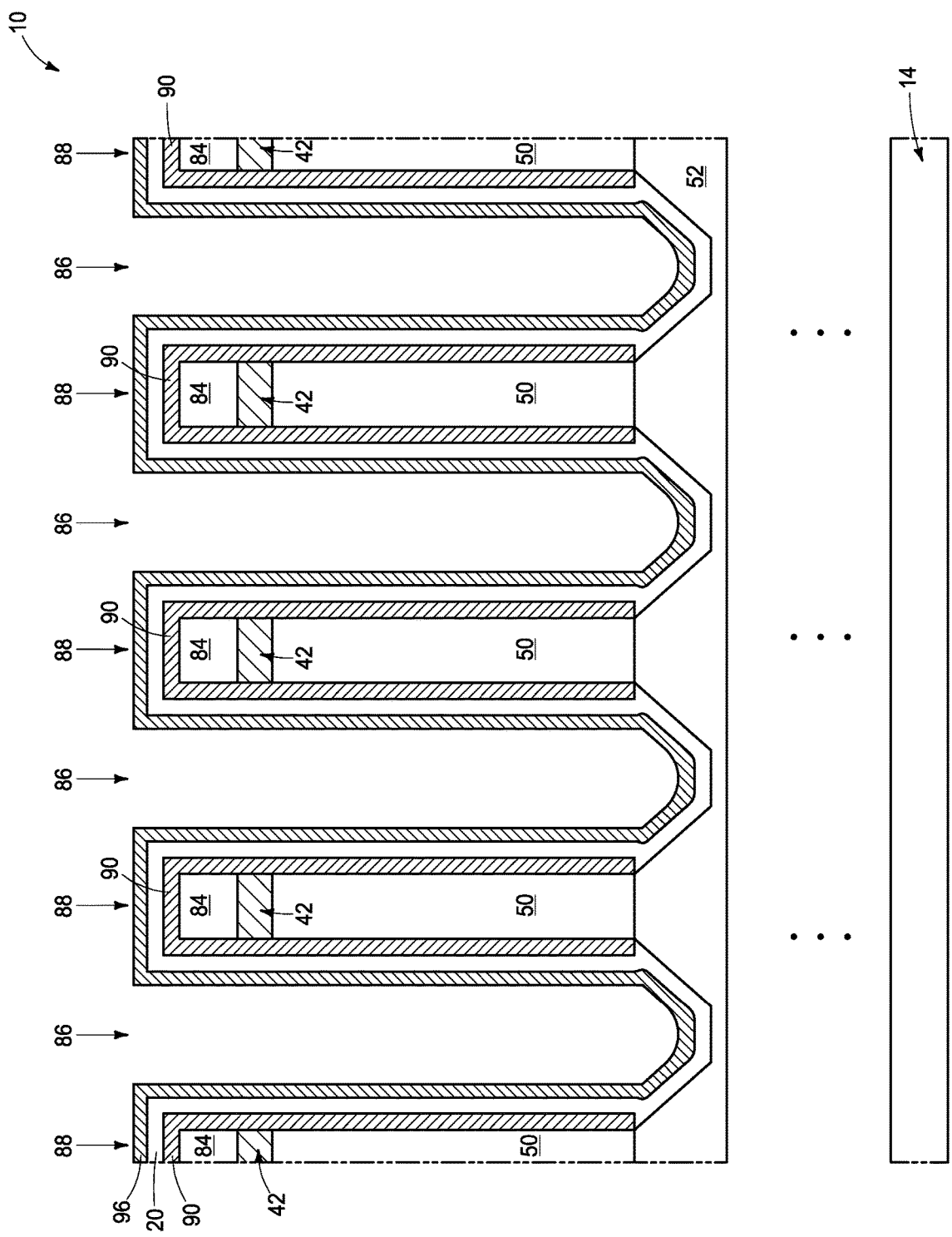
Figure 11:
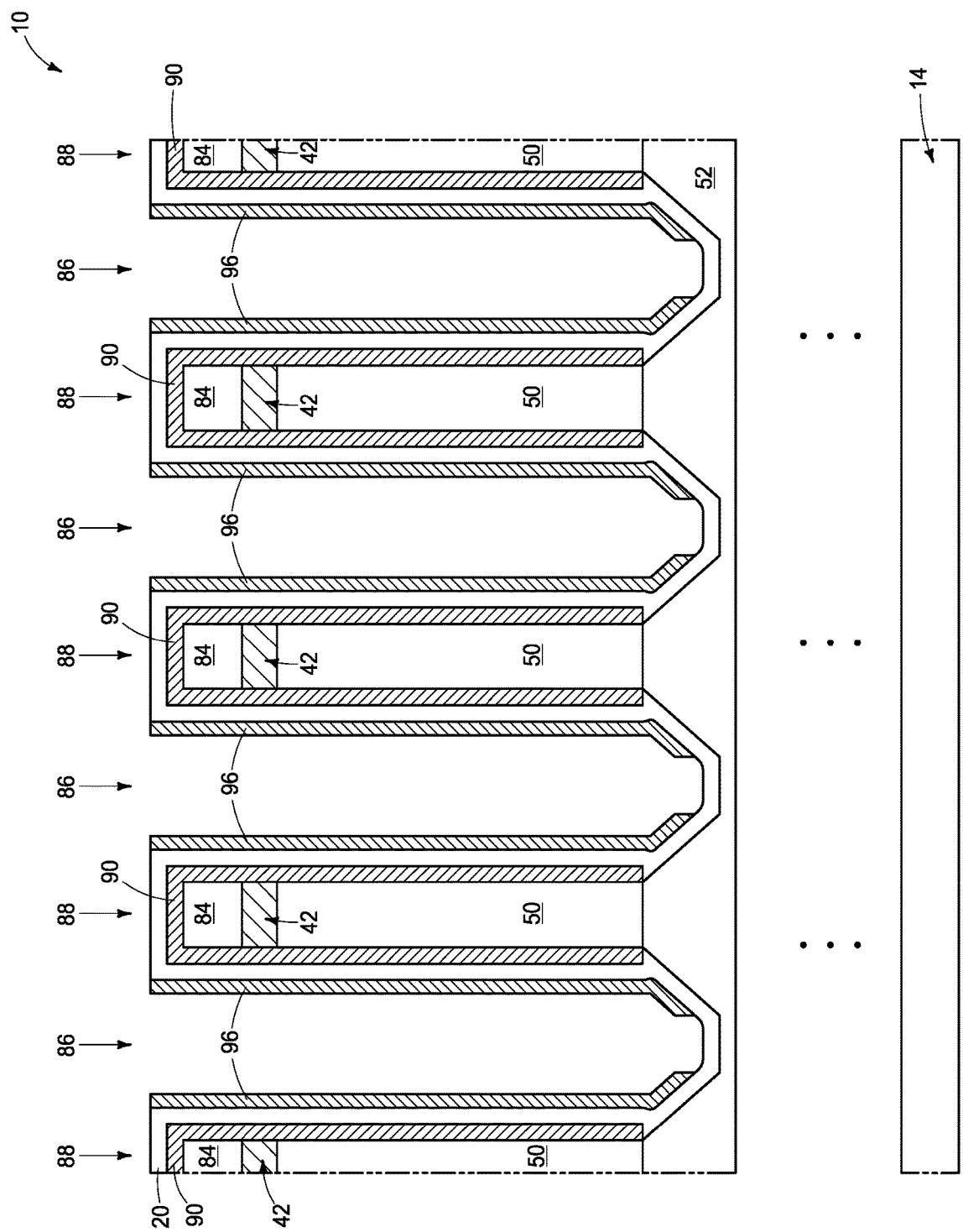

Referring to FIG. 10, dielectric material 20 is formed over conductive material 90 and within openings 86, and a conductive material 96 is formed over the dielectric material 20. The dielectric material 20 may comprise any of the compositions described above with reference to FIG. 1. The conductive material 96 is ultimately patterned into the conductive liners 26 of FIG. 1, and may comprise any of the compositions described above relative to such conductive liners. For instance, in some embodiments the conductive material 96 may comprise metal nitride; such as, for example, titanium nitride, tungsten nitride, etc. The dielectric material 20 may be formed to a thickness within a range of from about 40 Å to about 70 Å; and the conductive material 96 may be formed to a thickness within a range of from about 20 Å to about 50 Å.

Referring to the 11, the conductive material 96 is removed from the horizontal surfaces (i.e., the tops of spacing regions 88 and the bottoms of openings 86) with suitable etching (e.g., a punch etch).

Figure 12:
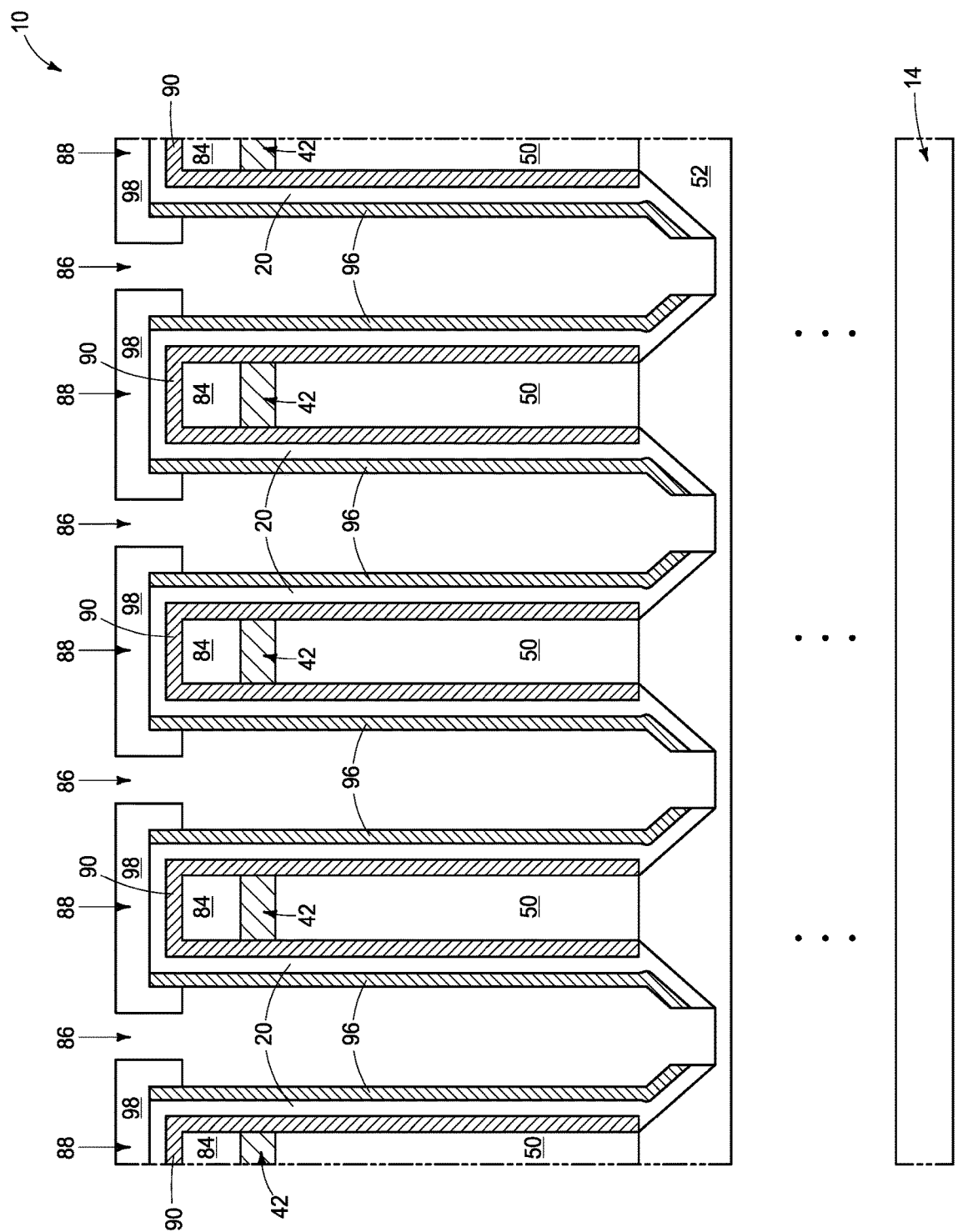

Referring to FIG. 12, masking material 98 is formed across the spacing regions 88 to partially block the openings 86. The masking material 98 may comprise, for example, one or more of carbon, silicon nitride, silicon oxide, etc.; and may be non-conformally deposited.

The masking material 98 is utilized to pattern openings etched through dielectric material 20.

Figure 13:
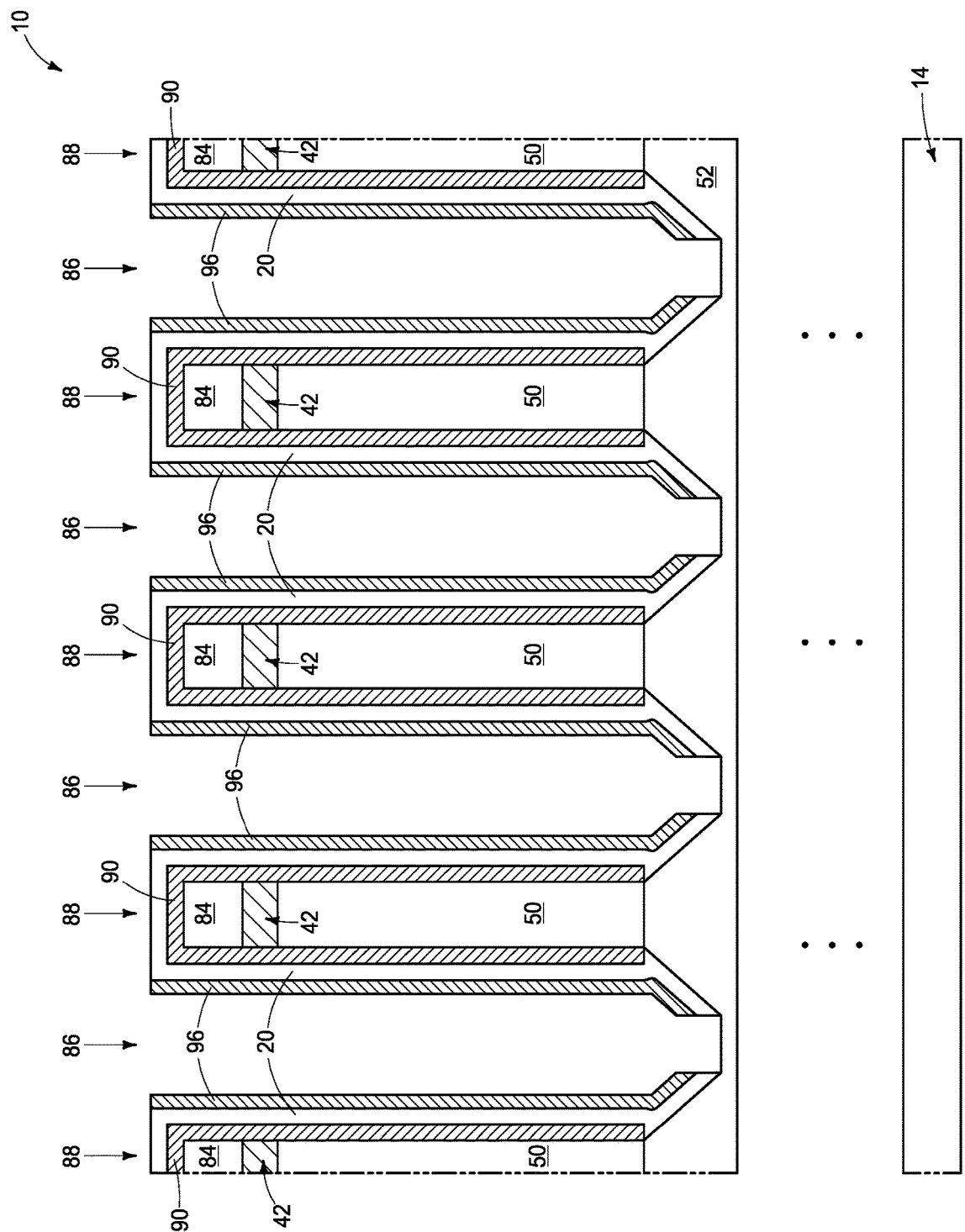

Referring to FIG. 13, masking material 98 (FIG. 12) is removed.

Figure 14:
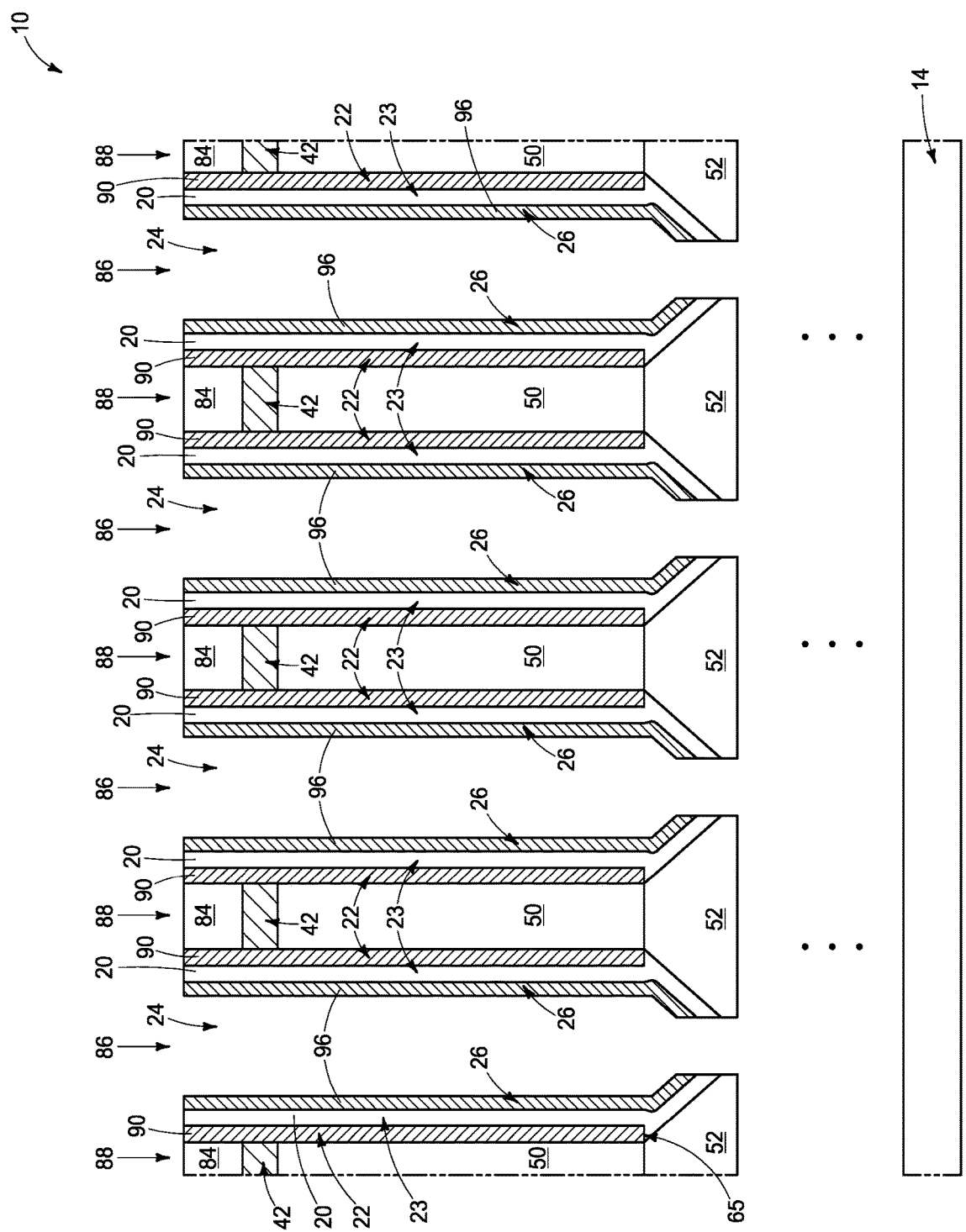

Referring to FIG. 14, openings 86 are extended through insulative material 52 with a suitable dry etch. The etching conditions may also remove materials 90, 20 and 96 from over the spacing regions 88, and may thin the sacrificial material 84 across the spacing regions 88.

As the materials 90, 20 and 96 are removed from over the spacing regions 88, such are patterned into the liners of FIG. 1. Specifically, material 90 is patterned into the conductive liners 22 corresponding to the second electrodes, the dielectric material 20 is patterned into the dielectric liners 23, and the conductive material 96 is patterned into the conductive liners 26.

Figure 15:
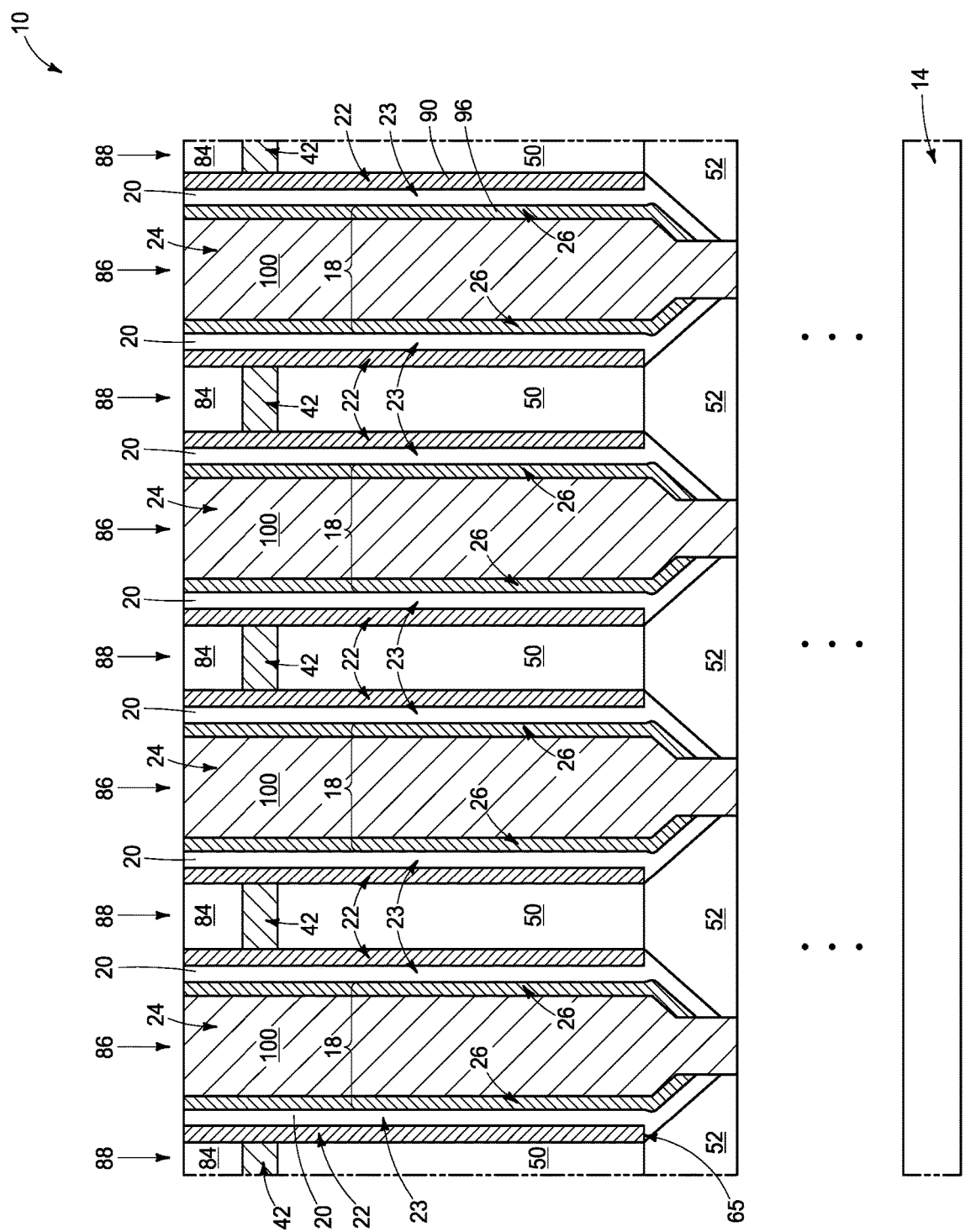

Referring to FIG. 15, conductive material 100 is provided within openings 86 and patterned into the conductive pillars 24. In some embodiments, conductive material 100 may be deposited within openings 86 and across spacing regions 88;

and may be patterned utilizing chemical-mechanical polishing (CMP) to remove excess conductive material 100 from over the spacing regions 88.

Figure 16:
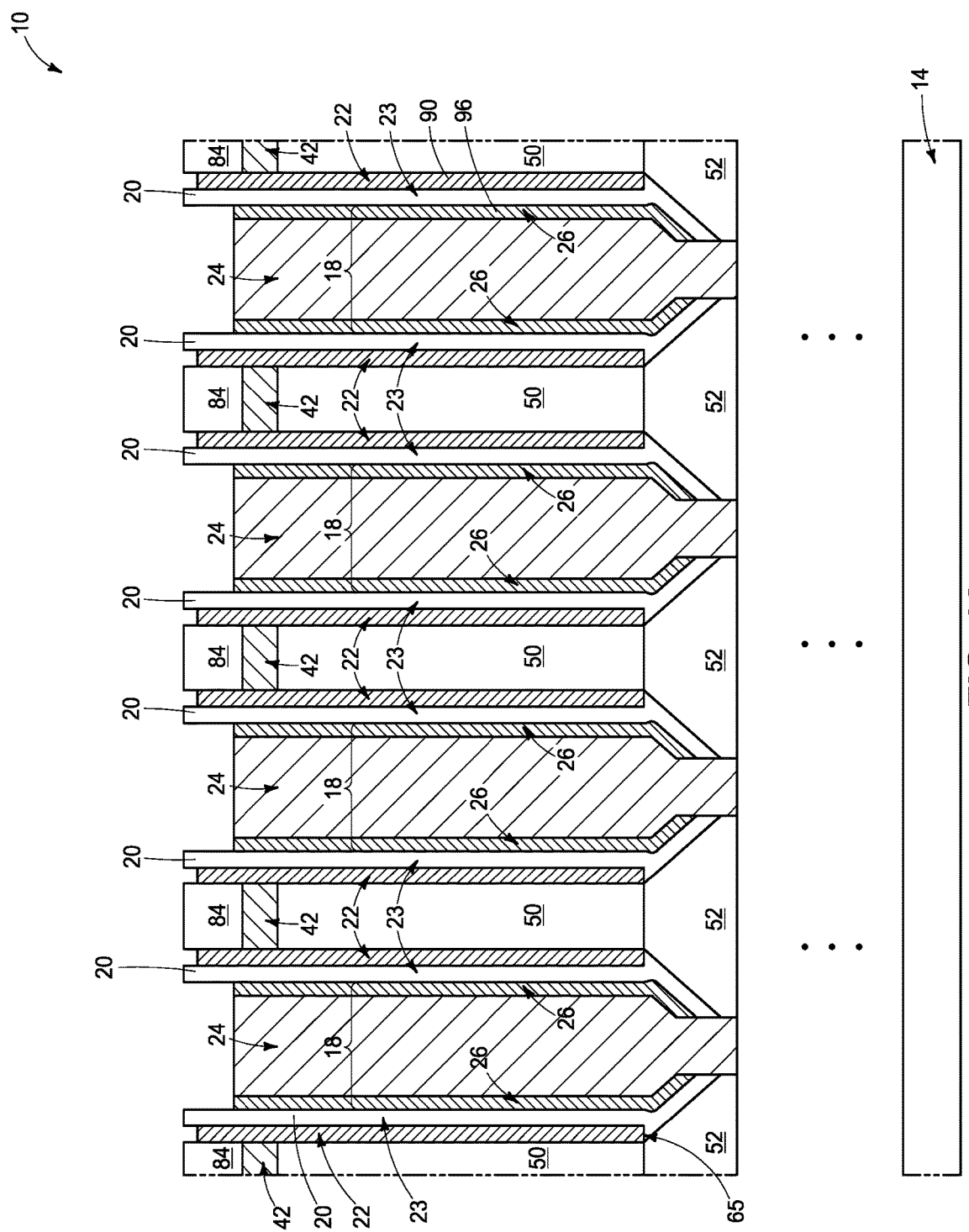

Referring to FIG. 16, pillars 24 are recessed with appropriate etching. Such etching may also recess the conductive liners 22 and 26.

Figure 17:
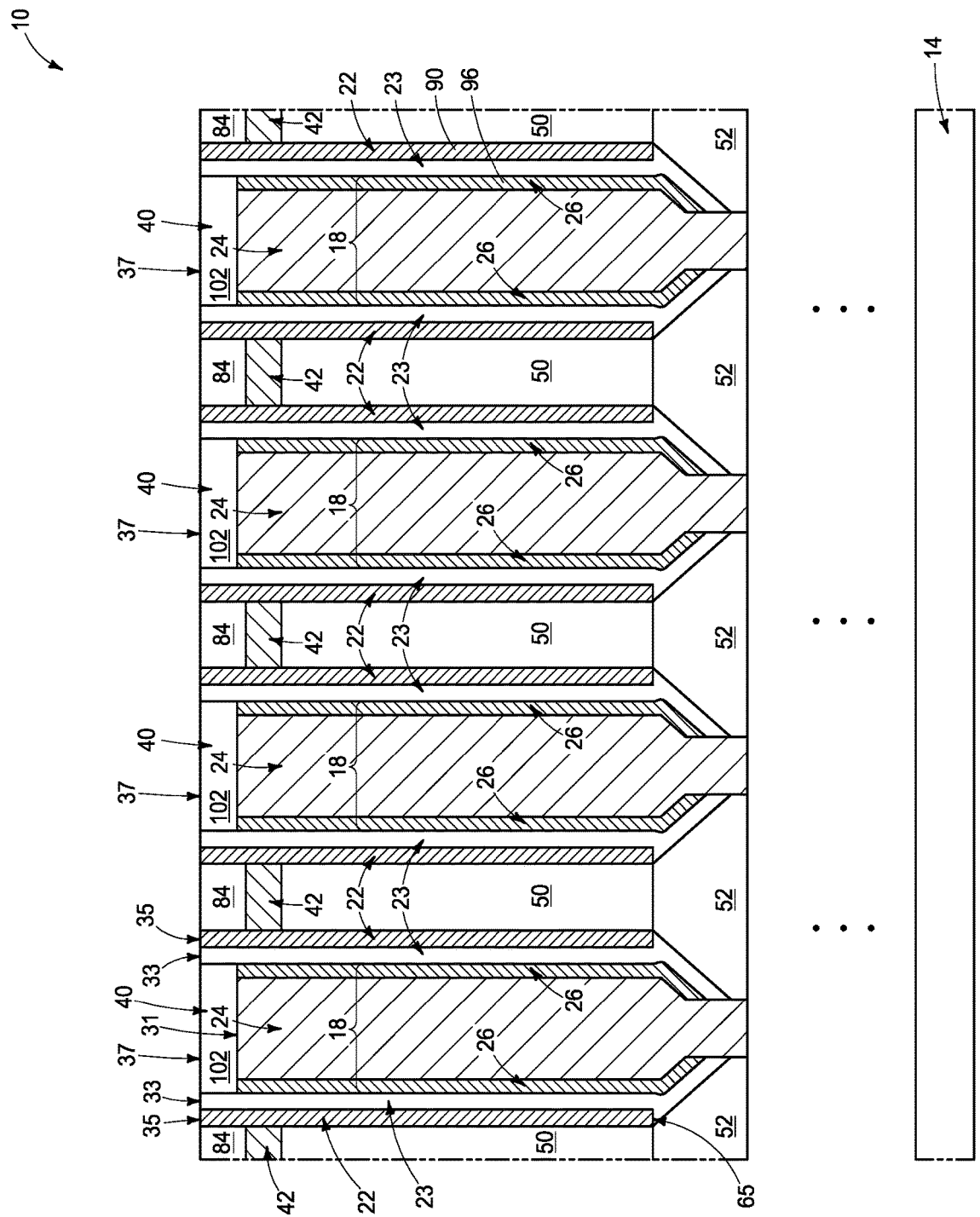

Referring to FIG. 17, insulative material 102 is provided across the recessed pillars 24 and patterned into the insulative pads 40. The insulative material 102 may comprise silicon dioxide, and may be formed with any suitable processing (for instance, spin-on processing, chemical vapor deposition, atomic layer deposition, etc.). The insulative material may be patterned into the pads 40 utilizing CMP.

Figure 18:
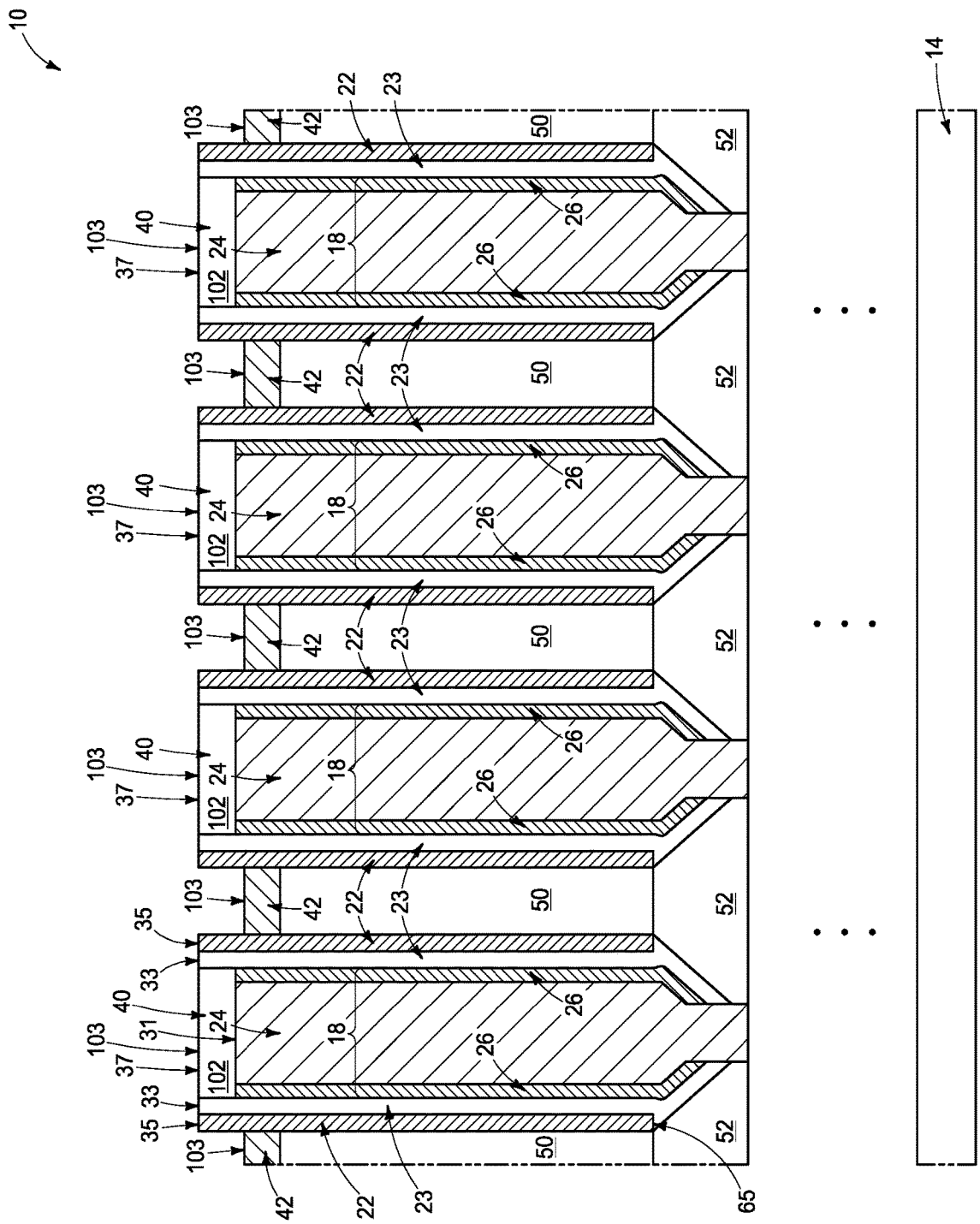

Referring to FIG. 18, sacrificial material 84 (FIG. 17) is removed. The assembly 10 has an undulating upper surface 103 at the processing stage of FIG. 18, with such upper surface 103 extending across conductive lattice 42, upper surfaces 33 of dielectric liners 23, upper surfaces 35 of conductive liners 22, and upper surfaces 37 of insulative pads 40.

Figure 19:
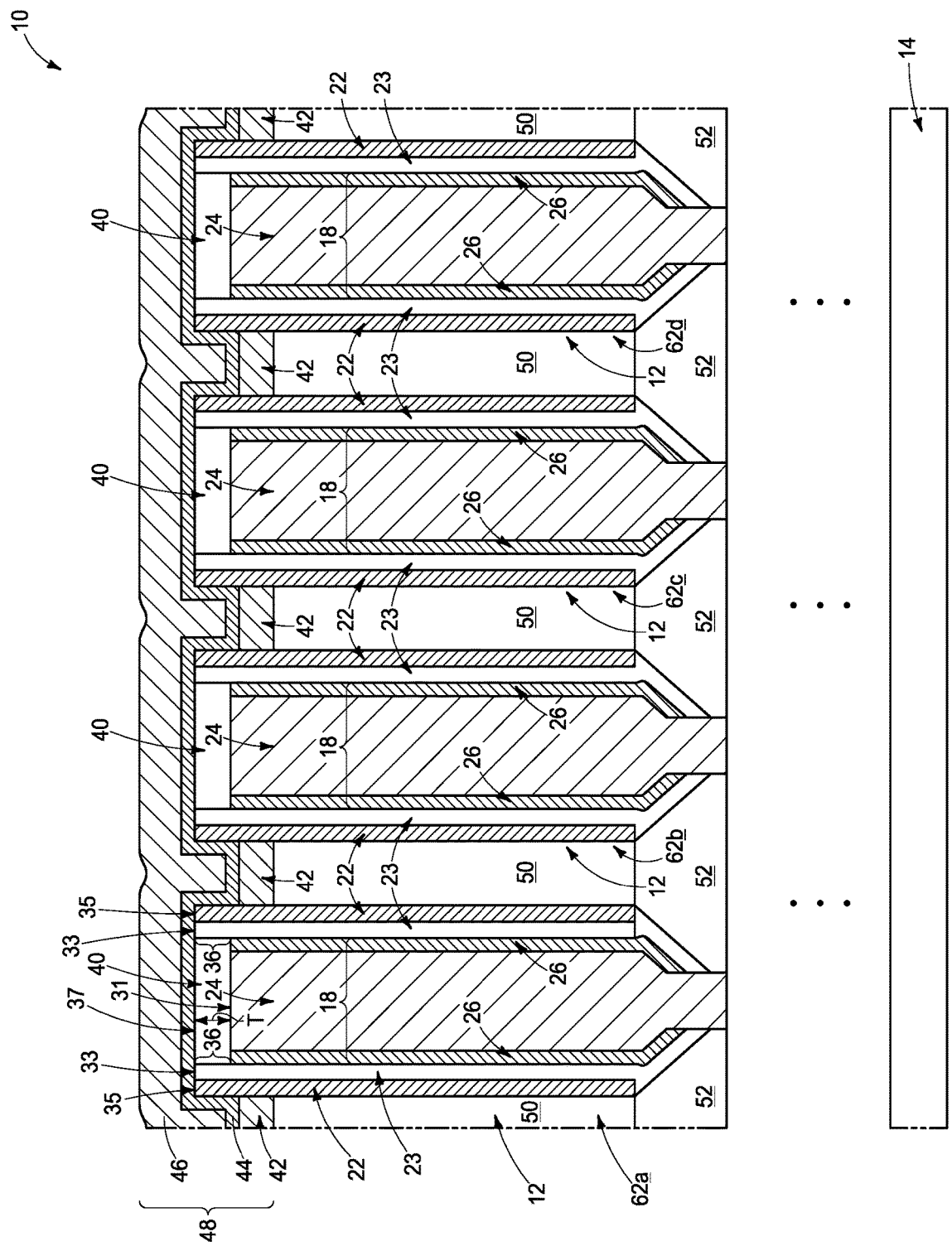

Referring to FIG. 19, the conductive materials 44 and 46 are formed to extend across the undulating upper surface 103 (with such surface 103 being labeled in FIG. 18). The construction of FIG. 19 is identical to that of FIG. 1, and comprises the capacitors 12 of the memory array 64. The transistors beneath the capacitors (transistors 16 of FIG. 1) are not shown in FIG. 19, but may be provided at any suitable processing stage, including, for example, a processing stage prior to formation of the stack 80 of FIG. 3.

Figure 20:
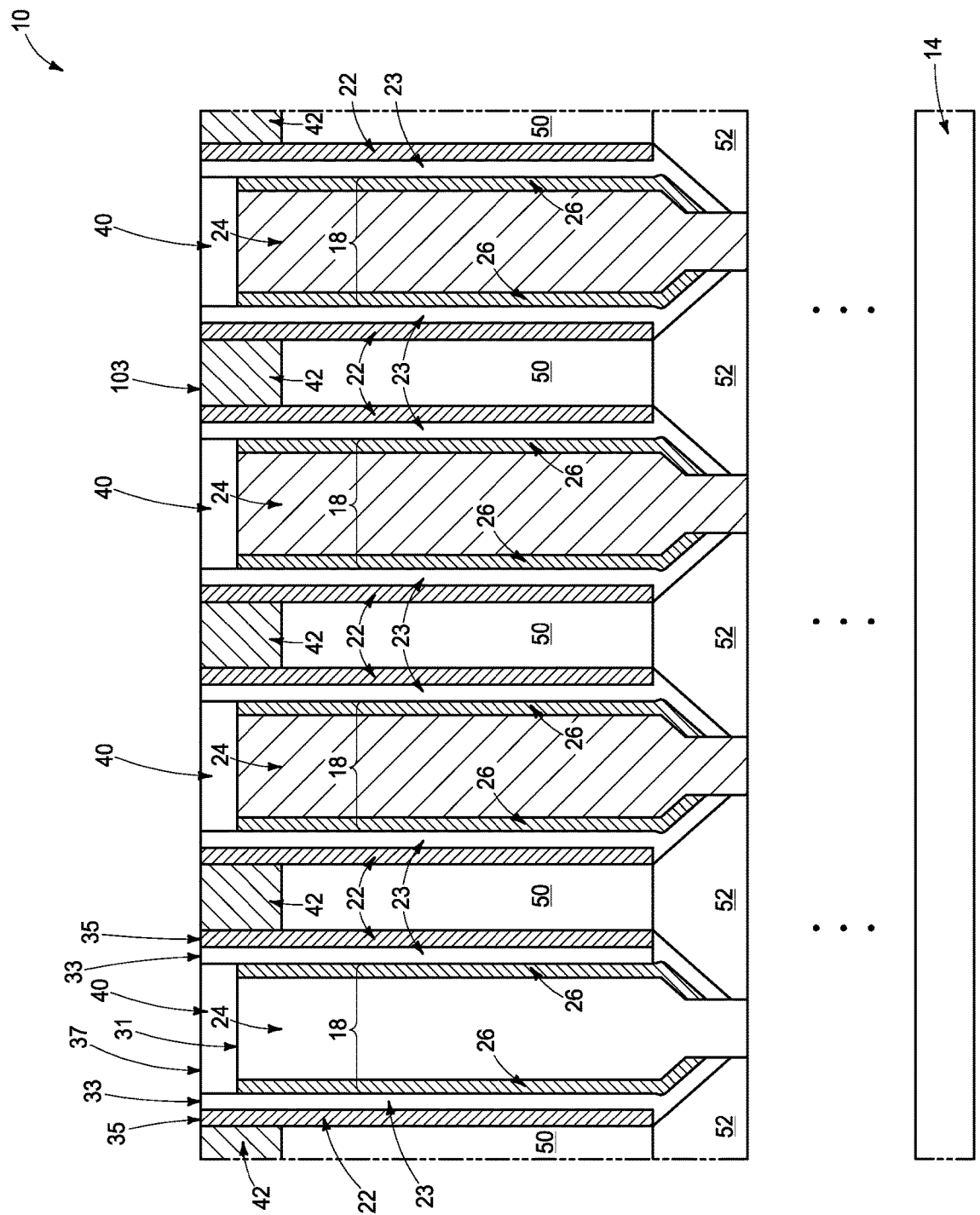

FIG. 20 shows a processing stage alternative to that of FIG. 18, with the construction 10 of FIG. 20 having a substantially planar upper surface 103 extending along an upper surface of the conductive lattice 42, the upper surfaces 37 of insulative pads 40, the upper surfaces 33 of dielectric liners 23, and the upper surfaces 35 of conductive liners 22. The term "substantially planar" means planar to within reasonable tolerances of fabrication and measurement.

Figure 21:
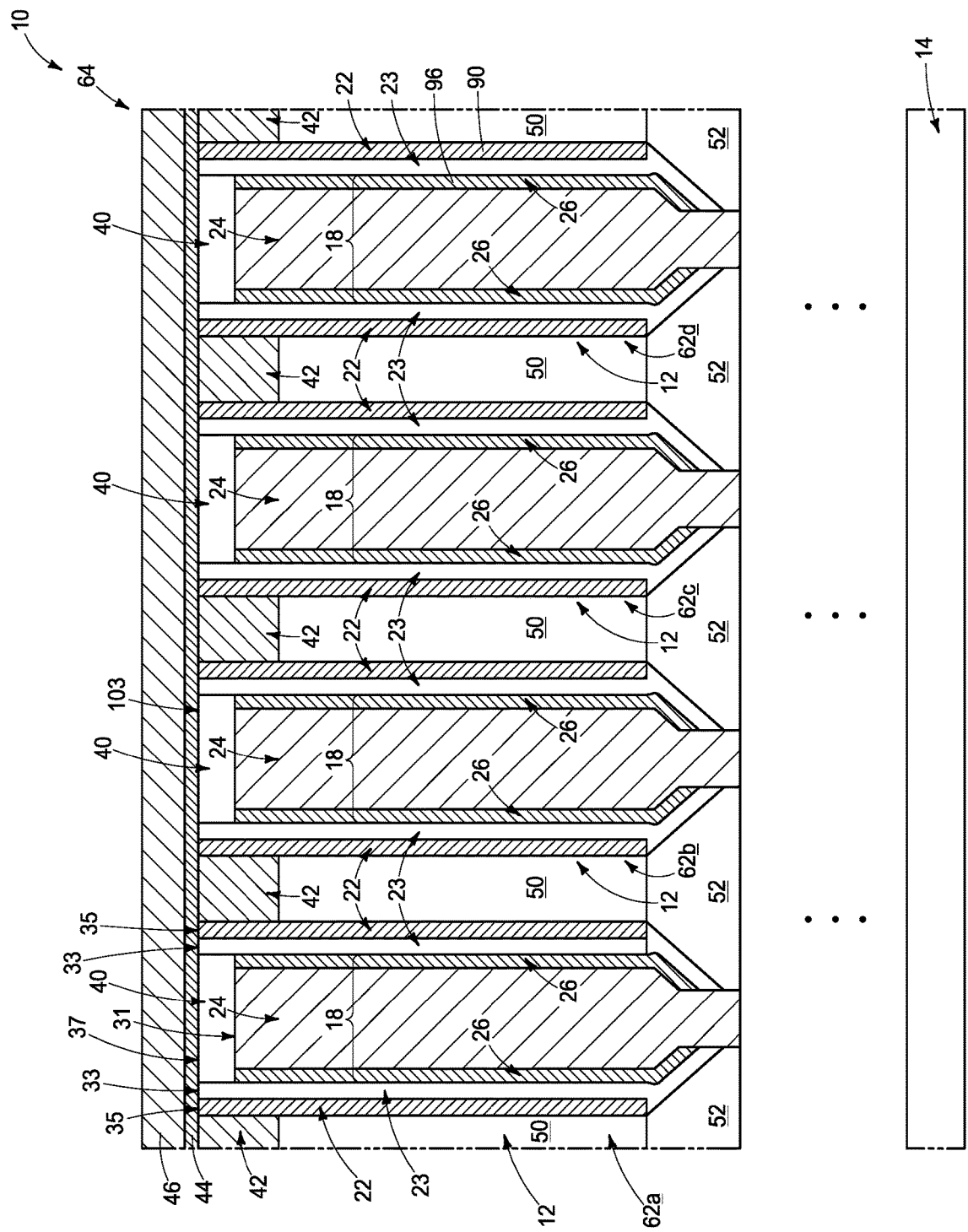

FIG. 21 shows a processing stage subsequent to that of FIG. 20, and in which the conductive materials 44 and 46 are formed to extend across the substantially planar upper surface 103.

Figure 22:
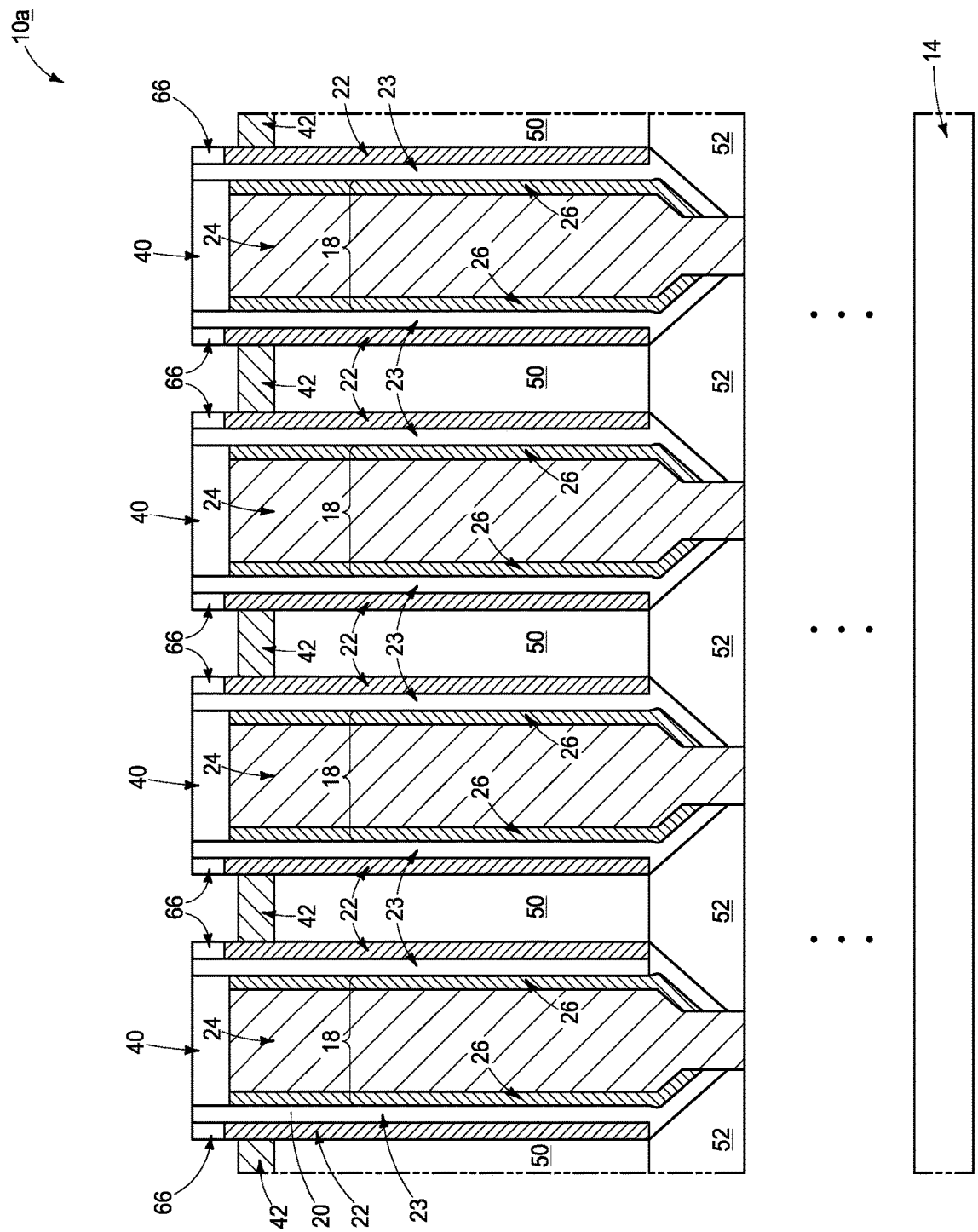

FIG. 22 shows a processing stage which may be subsequent to the processing stage of FIG. 18, and which may be utilized to form the assembly 10a of FIG. 2. Specifically, FIG. 22 shows the insulative spacers 66 (described above with reference to FIG. 2) formed over upper surfaces of the conductive liners 22. The insulative spacers 66 may be formed utilizing a process sequence in which upper regions of conductive liners 22 (with such upper regions being shown in FIG. 18) are removed to expose sidewalls of dielectric liners 23. Subsequently, insulative material of the spacers 66 is deposited across assembly 10 and along the exposed sidewalls of the dielectric liners; and then subjected to an anisotropic etch to pattern such insulative material into the illustrated spacers 66. In the shown embodiment, the spacers 66 have a lateral thickness which is substantially the same as the lateral thickness of the conductive liners 22 beneath such insulative spacers. In other embodiments, the insulative spacers may have lateral thicknesses greater than the lateral thicknesses of the conductive spacers 22 underlying such insulative spacers, or may have lateral thicknesses less than the lateral thicknesses of the conductive spacers 22 underlying such insulative spacers.

Figure 23:
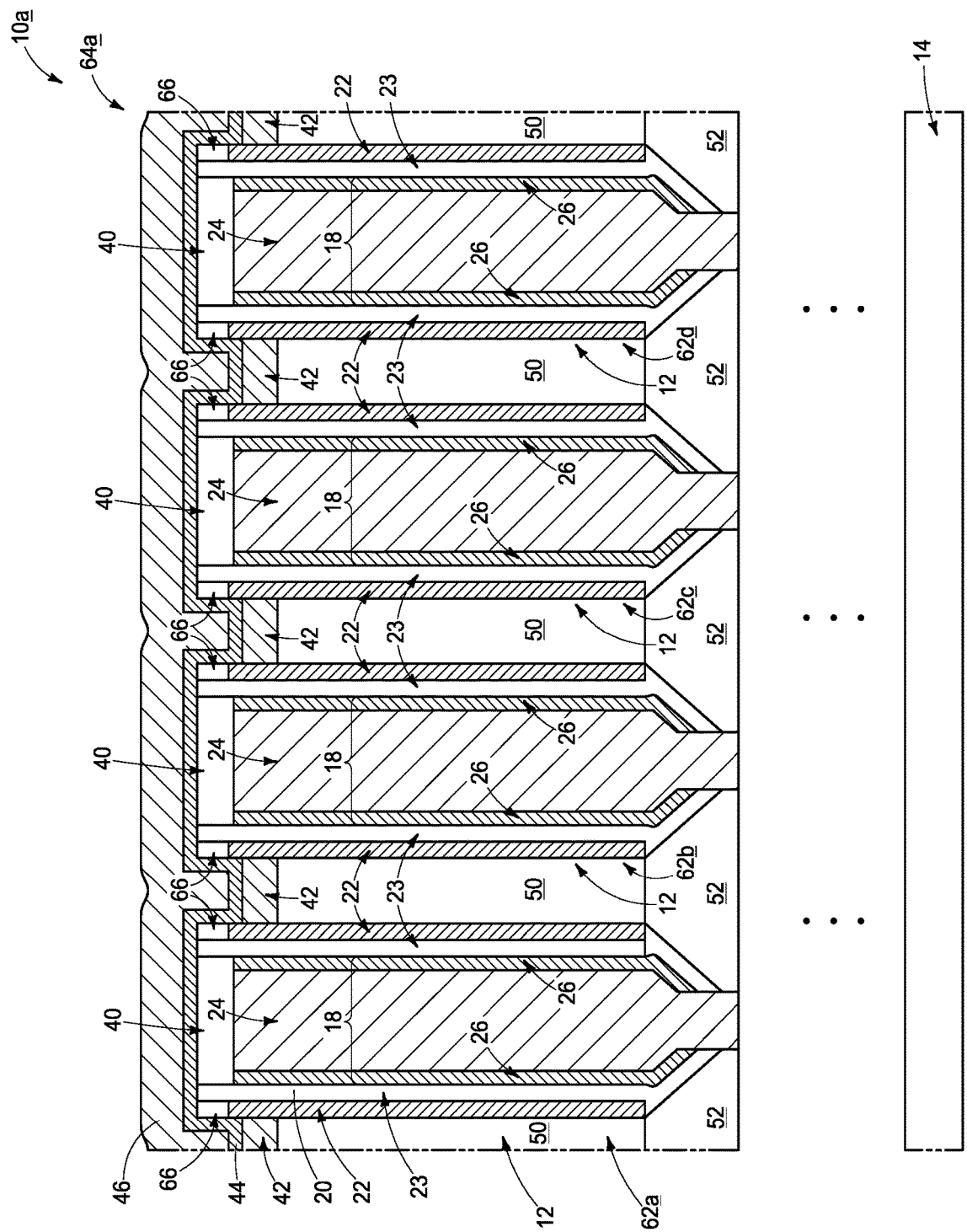

Referring to FIG. 23, the conductive materials 44 and 46 are formed to complete the fabrication of the assembly 10a of the type described above with reference to FIG. 2. The assembly of FIG. 23 differs slightly from that of FIG. 2 in that the spacers 66 are formed to be entirely vertically above the conductive lattice 42 in the embodiment of FIG. 23, whereas such spacers vertically overlapped the conductive lattice 42 in the embodiment of FIG. 2. Whether or not the spacers 66 overlap the conductive lattice 42 may be determined, at least in part, by amount of the conductive liner 22 removed by the etch described above with reference to FIG. 22 as being conducted prior to formation of the spacers 66.

Figure 24:
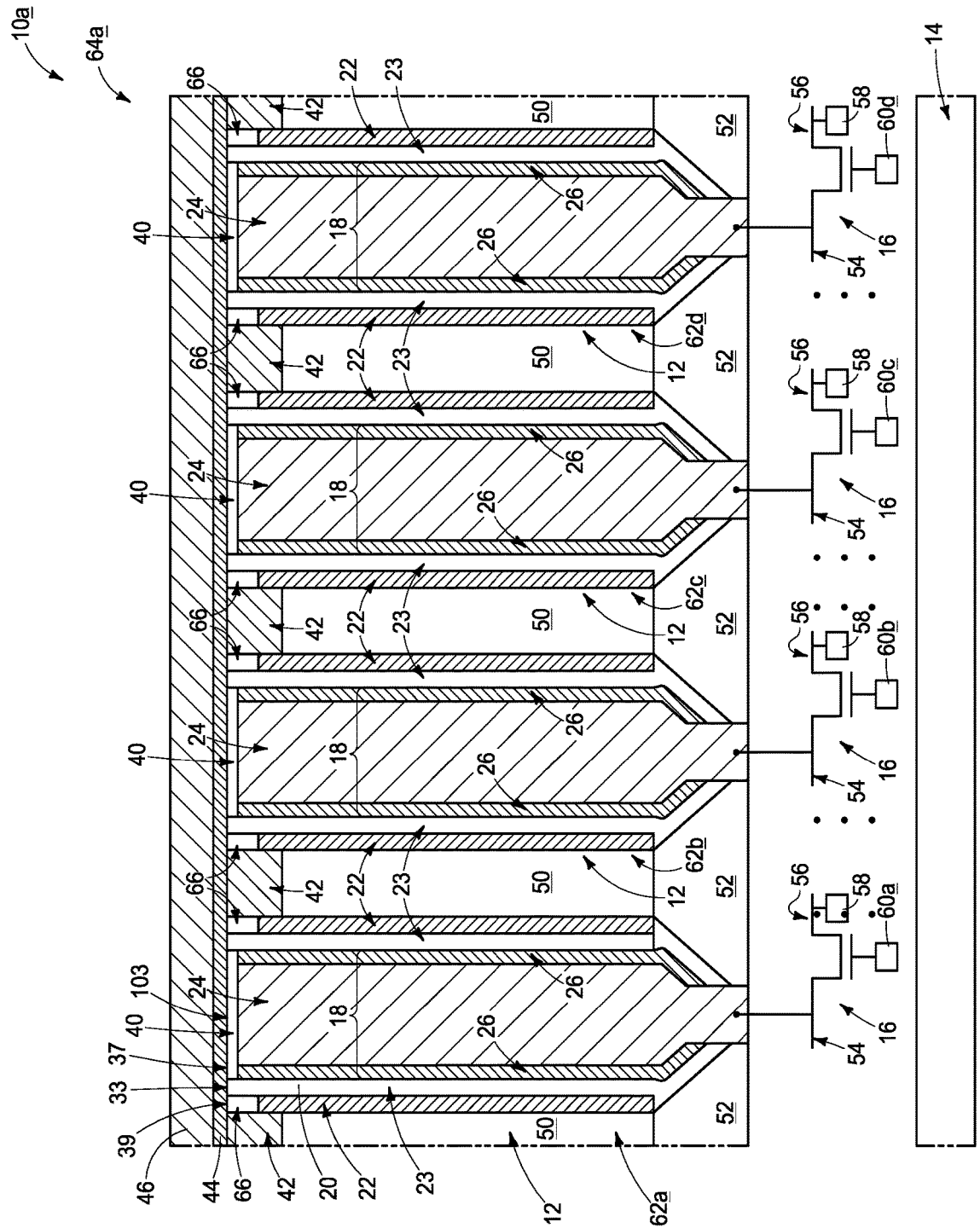

Referring to FIG. 24, such shows assembly 10a in a configuration alternative to that of FIG. 21, and specifically comprising a planar surface 103 extending across an upper surface the conductive lattice 42, upper surfaces 39 (only one which is labeled) of spacers 66 and upper surfaces 33 (only one which is labeled) of insulative liners 23. The conductive materials 44 and 46 extend across the planar surface 103.

The transistors 16 are shown in FIG. 24 in order to fully illustrate a region of the shown example memory array 64a.

Figure 25:
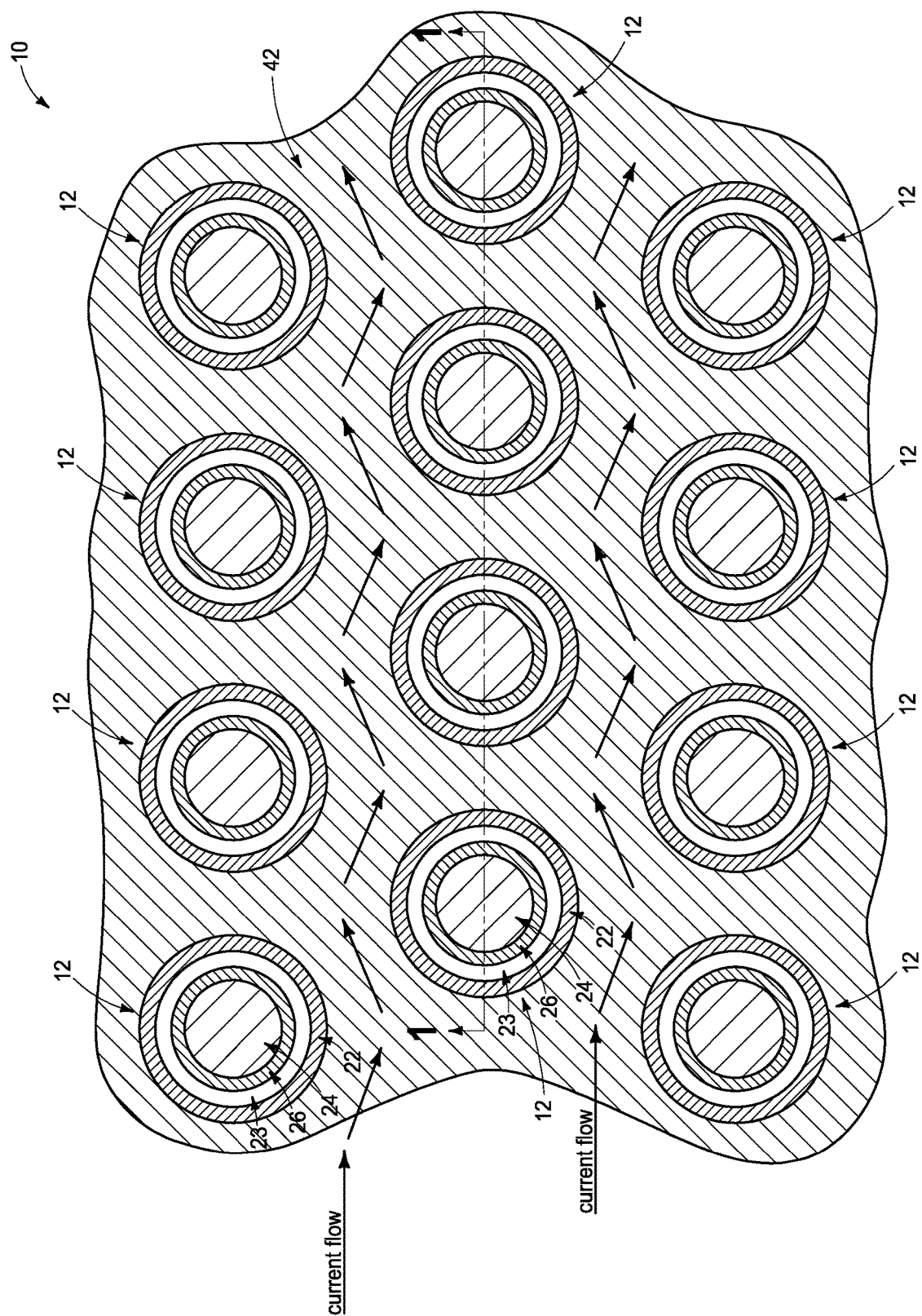
FIG. 25 is a diagrammatic cross-sectional top view through a plurality of capacitors of an example memory array, and illustrates example current flow along the conductive plates of such capacitors.

FIG. 25 shows a horizontal cross-section along the line 25-25 of FIG. 1 (with the cross-section of FIG. 1 being along the line 1-1 of FIG. 25). Current flow along the conductive lattice 42 is illustrated in FIG. 25. Such current flow advantageously serpentines around outer surfaces of the capacitors 12 as the current flows through the conductive lattice 42 of the plate 48 (FIG. 1).

Figure 26:
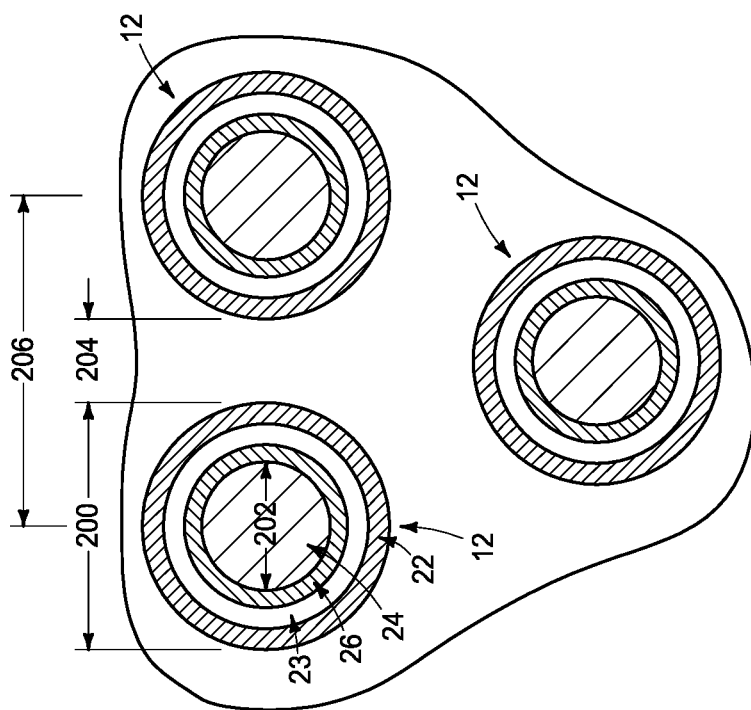
FIGS. 26-28 are diagrammatic cross-sectional top views through a plurality of capacitors of example memory arrays.

FIG. 26 shows a horizontal cross-section through several capacitors, and shows example dimensions relative to the capacitors. The capacitors have overall widths 200 which may be within a range of from about 20 nm to about 80 nm. The inner pillar 24 has a width 202 which may be within a range of from about 5 nm to about 25 nm. Adjacent capacitors may be separated by a distance 204 which may be less than 5 nm, less than 2 nm, or even less than 1 nm. A center to center distance 206 between adjacent capacitors may be within a range of from about 20 nm to about 80 nm.

Figure 27:
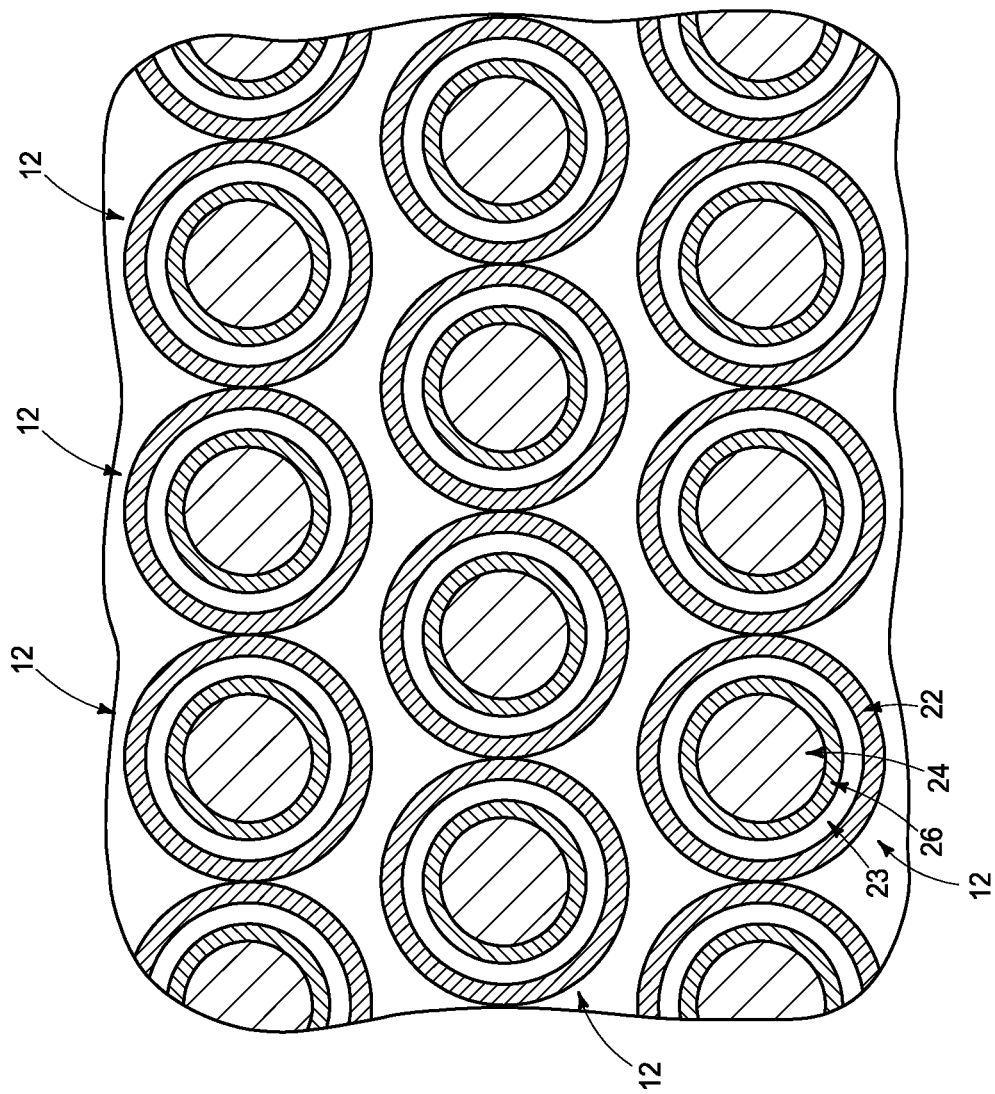
Figure 28:
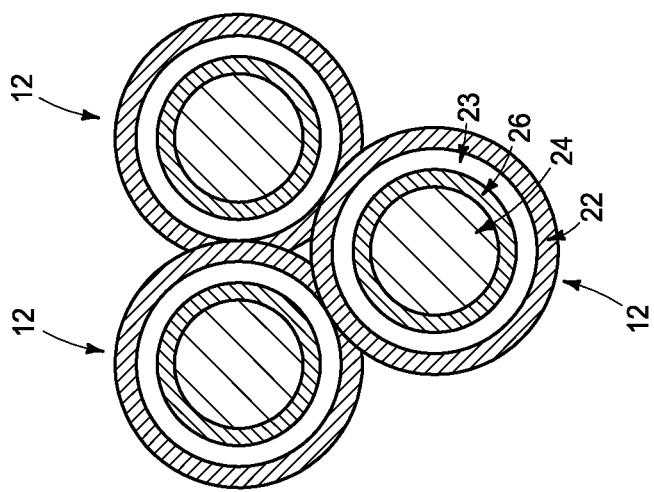

In some embodiments, adjacent capacitors may merge together if portions of the openings 86 (FIG. 5) merge. FIGS. 27 and 26 illustrate possible configurations which may result from merging of two or more of the stud-type capacitors with one another. Such may advantageously increase packing density.

The capacitors described herein may be utilized for memory (as shown in some of the embodiments described herein); including 1-transistor-1-capacitor (1T1C) memory, 2-transistor-1-capacitor (2T1C) memory, 2-transistor-2-capacitor (2T2C) memory, 3-transistor-1-capacitor (3T1C) memory, etc. The capacitor dielectric materials described above may include ferroelectric materials in some embodiments, and the capacitors may correspond to ferroelectric capacitors, or may be otherwise incorporated into ferroelectric memory. The capacitors described herein may also be utilized in other types of circuitry in addition to, or alternatively to, memory; including, for example, processor circuitry, sensor circuitry, etc.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an integrated capacitor assembly having a conductive pillar supported by a base, with the conductive pillar being included in a first electrode of a capacitor. The conductive pillar has a first upper surface. A dielectric liner is along an outer surface of the conductive pillar and has a second upper surface. A conductive liner is along the dielectric liner and is included within a second electrode of the capacitor. The conductive liner has a third upper surface. One of the first and third upper surfaces is above the other of the first and third upper surfaces. The second upper surface is at least as high above the base as said one of the first and third upper surfaces.

Some embodiments include an integrated capacitor assembly having a conductive pillar supported by a base, with the conductive pillar being included in a first electrode of a capacitor and having a first upper surface. A dielectric liner is along an outer surface of the conductive pillar. The dielectric liner has a second upper surface. A conductive liner is along the dielectric liner and is included within a second electrode of the capacitor. The conductive liner has a third upper surface which is beneath the first upper surface. An insulative spacer is over the third upper surface and has a fourth upper surface which is substantially coplanar with the second upper surface. An insulative material extends entirely across the first upper surface and has a vertical thickness. The second upper surface is above the first upper surface by a distance substantially equal to the vertical thickness. A conductive plate directly contacts the conductive liner, and extends over and entirely across the insulative material.

Some embodiments include an integrated assembly having conductive pillars supported by a base and being included within first electrodes of capacitors, with the conductive pillars having first upper surfaces. Dielectric liners are along outer surfaces of the conductive pillars, and have second upper surfaces. Conductive liners are along the dielectric liners and are included within second electrodes of the capacitors. The conductive liners have third upper surfaces. The third upper surfaces are beneath the first upper surfaces. Insulative pads are over the first upper surfaces and have fourth upper surfaces. Insulative spacers are over the conductive liners and have fifth upper surfaces. The second upper surfaces, fourth upper surfaces and fifth upper surfaces are substantially coplanar with one another. A conductive plate extends across the insulative pads and laterally outwardly from the conductive liners. The conductive plate electrically couples the conductive liners to one another.

Some embodiments include an integrated assembly having conductive pillars supported by a base and being included within first electrodes of capacitors, with the conductive pillars having first upper surfaces. Dielectric liners are along outer surfaces of the conductive pillars, and have second upper surfaces. Conductive liners are along the dielectric liners and are included within second electrodes of the capacitors. The conductive liners have third upper surfaces. The first upper surfaces are beneath the third upper surfaces. Insulative pads being are over the first upper surfaces and have fourth upper surfaces. The second upper surfaces, third upper surfaces and fourth upper surfaces are substantially coplanar with one another. A conductive plate extends across the insulative pads and laterally outwardly from the conductive liners. The conductive plate electrically couples the conductive liners to one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   conductive pillars supported by a base and included within first electrodes of capacitors; the conductive pillars having first upper surfaces;
   dielectric liners along outer surfaces of the conductive pillars; the dielectric liners having second upper surfaces;
   conductive liners along the dielectric liners and included within second electrodes of the capacitors; the conductive liners having third upper surfaces;
   the first upper surfaces being beneath the third upper surfaces;
   insulative pads being over the first upper surfaces and having fourth upper surfaces;
   the second upper surfaces, third upper surfaces and fourth upper surfaces being substantially coplanar with one another; and
   a conductive plate extending across the insulative pads and laterally outwardly from the conductive liners; the conductive plate electrically coupling the conductive liners to one another.

2. The integrated assembly of claim 1 wherein the capacitors are in an hexagonally packed arrangement.

3. The integrated assembly of claim 1 wherein the capacitors are electrically coupled with source/drain regions of transistors and are comprised by memory cells of a memory array.

4. The integrated assembly of claim 1 wherein the conductive plate comprises a metal-containing material over a conductively-doped semiconductor material, and wherein both the metal-containing material and the conductively-doped semiconductor material vertically overlap the conductive liners.

5. The integrated assembly of claim 1 wherein the conductive plate comprises a metal-containing material over a conductively-doped semiconductor material, and wherein only the conductively-doped semiconductor material vertically overlaps the conductive liners.

6. The integrated assembly of claim 1 wherein the conductive plate contacts at least one of the following upper surfaces:
a) the second upper surfaces of the dielectric liners;
b) the third upper surfaces of the conductive liners; and
c) the fourth upper surfaces of the insulative pads.

7. The integrated assembly of claim 6 wherein the conductive plate contacts at least two of the upper surfaces.

8. The integrated assembly of claim 6 wherein the conductive plate contacts all three of the upper surfaces.

9. The integrated assembly of claim 1 wherein the insulative pads contact only one of the upper surfaces.

10. The integrated assembly of claim 9 wherein the only one of the upper surfaces contacted is the first upper surfaces of the conductive pillars.

11. The integrated assembly of claim 1 wherein the dielectric liners comprise sidewall surfaces and the conductive liners extend along the sidewall surfaces of the dielectric liners.

12. The integrated assembly of claim 1 wherein the dielectric liners comprise sidewall surfaces and the conductive liners contact the sidewall surfaces of the dielectric liners.

13. The integrated assembly of claim 1 wherein the dielectric liners comprise sidewall surfaces and wherein the conductive liners comprise sidewall surfaces, the two sidewall surfaces contacting each other.

14. The integrated assembly of claim 1 wherein the dielectric liners comprise sidewall surfaces and the conductive liners comprise sidewall surfaces, wherein the two sidewall surfaces extend along each other in a parallel relationship.

15. The integrated assembly of claim 1 wherein the first electrodes comprise the conductive pillars and an another set of conductive liners that extend along outer lateral surfaces of the conductive pillars.

16. The integrated assembly of claim 15 wherein the another set of conductive liners of the first electrodes and the conductive liners of the second electrodes extend along each other in a parallel relationship.

17. The integrated assembly of claim 15 wherein the another set of conductive liners of the first electrodes and the conductive liners of the second electrodes both comprise the same electrically conductive compositions.

18. The integrated assembly of claim 15 wherein the another set of conductive liners of the first electrodes and the conductive liners of the second electrodes comprise different electrically conductive compositions.

* * * * *